United States Patent
Imasaka et al.

(10) Patent No.: US 11,824,085 B2
(45) Date of Patent: Nov. 21, 2023

(54) SEMICONDUCTOR DEVICE COMPRISING A MOSFET HAVING A RESURF REGION AND HIGHER PEAK IMPURITY CONCENTRATION DIFFUSION REGION IN THE RESURF REGION

(71) Applicant: Mitsubishi Electric Corporation, Tokyo (JP)

(72) Inventors: Toshihiro Imasaka, Tokyo (JP); Kazuhiro Shimizu, Tokyo (JP); Manabu Yoshino, Tokyo (JP); Yuji Kawasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/075,032

(22) Filed: Oct. 20, 2020

(65) Prior Publication Data
US 2021/0202694 A1    Jul. 1, 2021

(30) Foreign Application Priority Data
Dec. 25, 2019 (JP) .................................. 2019-234187

(51) Int. Cl.
*H01L 29/06* (2006.01)
*H01L 29/78* (2006.01)

(52) U.S. Cl.
CPC ........ *H01L 29/063* (2013.01); *H01L 29/7816* (2013.01)

(58) Field of Classification Search
CPC ........................ H01L 29/063; H01L 29/7816
See application file for complete search history.

(56) References Cited

U.S. PATENT DOCUMENTS

| 4,292,642 A | 9/1981 | Appels et al. |
| 5,894,156 A | 4/1999 | Terashima et al. |

(Continued)

FOREIGN PATENT DOCUMENTS

| JP | 2005-251903 A | 9/2005 |
| JP | 3917211 B2 | 5/2007 |

(Continued)

OTHER PUBLICATIONS

J. A. Appels, et al., "Thin Layer High-Voltage Devices (Resurf Devices)" Philips Journal of Research, vol. 35 No. 1 (1980): pp. 1-13.

(Continued)

*Primary Examiner* — Anh D Mai
(74) *Attorney, Agent, or Firm* — Studebaker & Brackett PC

(57) ABSTRACT

Provided is a semiconductor device including: an N-type diffusion layer being a second region, formed in a surface portion of a P-type diffusion layer being a first region, to function as a RESURF region; an N-type buried diffusion layer being a third region formed in a bottom portion of the second region, close to a high-side circuit; and a MOSFET using the second region as a drift layer. The MOSFET includes a thermal oxide film formed between an N-type diffusion layer being a fourth region serving as a drain region and an N-type diffusion layer being a sixth region serving as a source region, and an N-type diffusion layer being a seventh region formed below the thermal oxide film. The seventh region has an end portion close to a low-side circuit, being closer to the low-side circuit than an end portion of the third region close to the low-side circuit.

2 Claims, 25 Drawing Sheets

(56) References Cited

U.S. PATENT DOCUMENTS

| | | | |
|---|---|---|---|
| 8,362,830 B2 | 1/2013 | Shimizu | |
| 2005/0194656 A1 | 9/2005 | Shimizu | |
| 2008/0009113 A1* | 1/2008 | Shimizu | ................ H01L 27/088 257/E27.06 |
| 2010/0148823 A1* | 6/2010 | Shimizu | .............. H01L 29/7817 326/102 |
| 2011/0316115 A1 | 12/2011 | Shimizu | |
| 2014/0167171 A1* | 6/2014 | Kaya | ..................... H01L 21/761 257/367 |
| 2015/0270390 A1* | 9/2015 | Kaya | ..................... H01L 29/407 257/339 |
| 2017/0062567 A1* | 3/2017 | Kaya | ..................... H01L 29/405 |
| 2017/0345887 A1* | 11/2017 | Ichikawa | ............ H01L 29/0878 |

FOREIGN PATENT DOCUMENTS

| | | | |
|---|---|---|---|
| JP | 2012-009694 A | 1/2012 | |
| JP | 5488256 B2 | 5/2014 | |
| JP | 2017-212298 A | 11/2017 | |
| WO | WO-2018051412 A1 * | 3/2018 | ......... H01L 27/0617 |

OTHER PUBLICATIONS

An Office Action; "Notice of Reasons for Refusal," mailed by the Japanese Patent Office dated Jan. 31, 2023, which corresponds to Japanese Patent Application No. 2019-234187 and is related to U.S. Appl. No. 17/075,032; with English language translation.

An Office Action; "Notice of Reasons for Refusal," mailed by the Japanese Patent Office dated Jul. 11, 2023, which corresponds to Japanese Patent Application No. 2019-234187 and is related to U.S. Appl. No. 17/075,032; with English language translation.

* cited by examiner

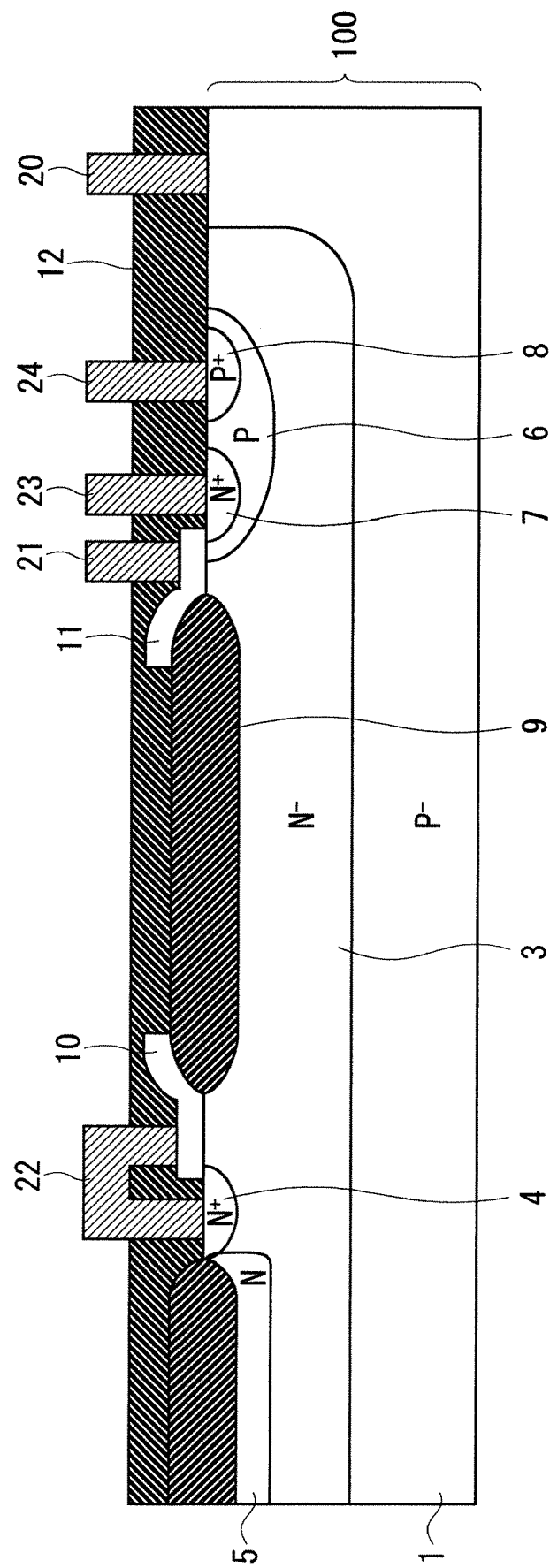
FIG. 2 --Prior Art--

F I G. 8
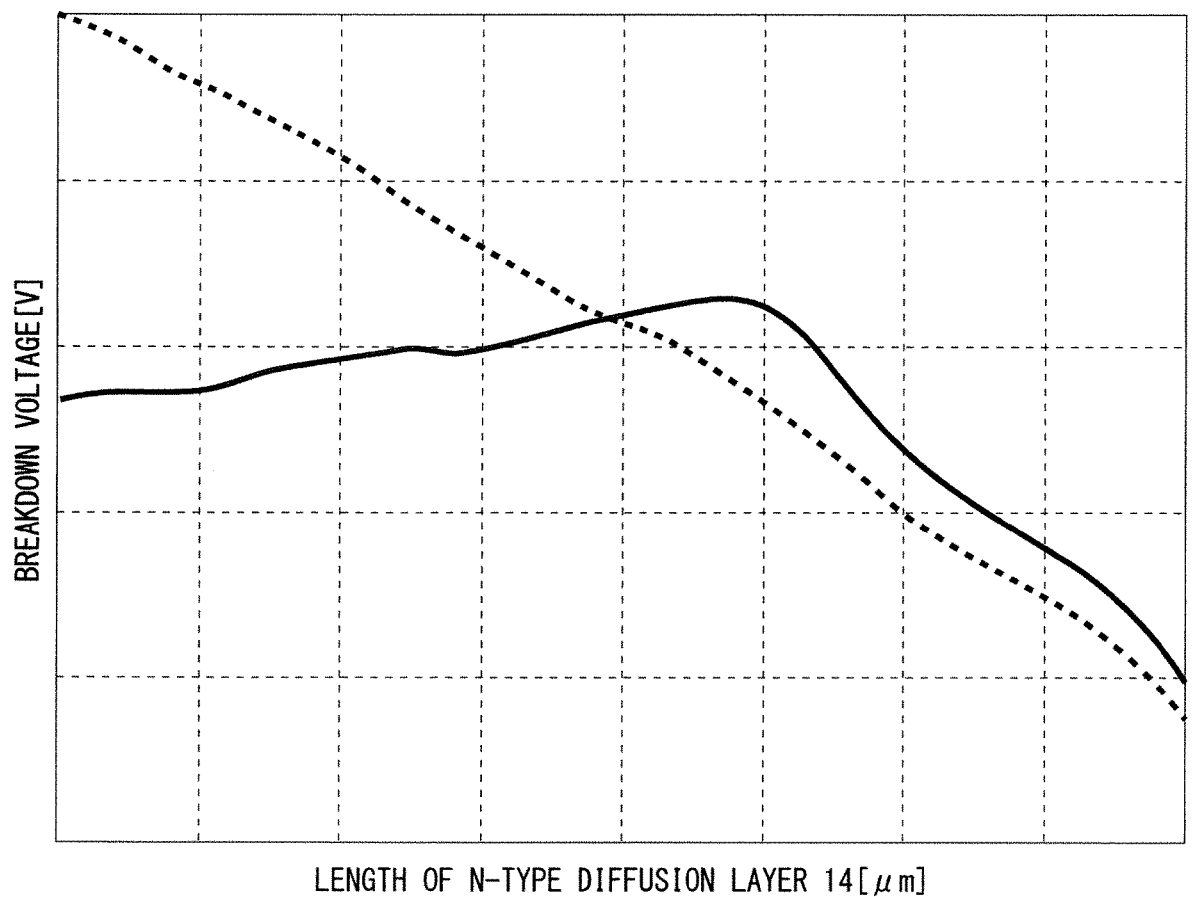

F I G. 9
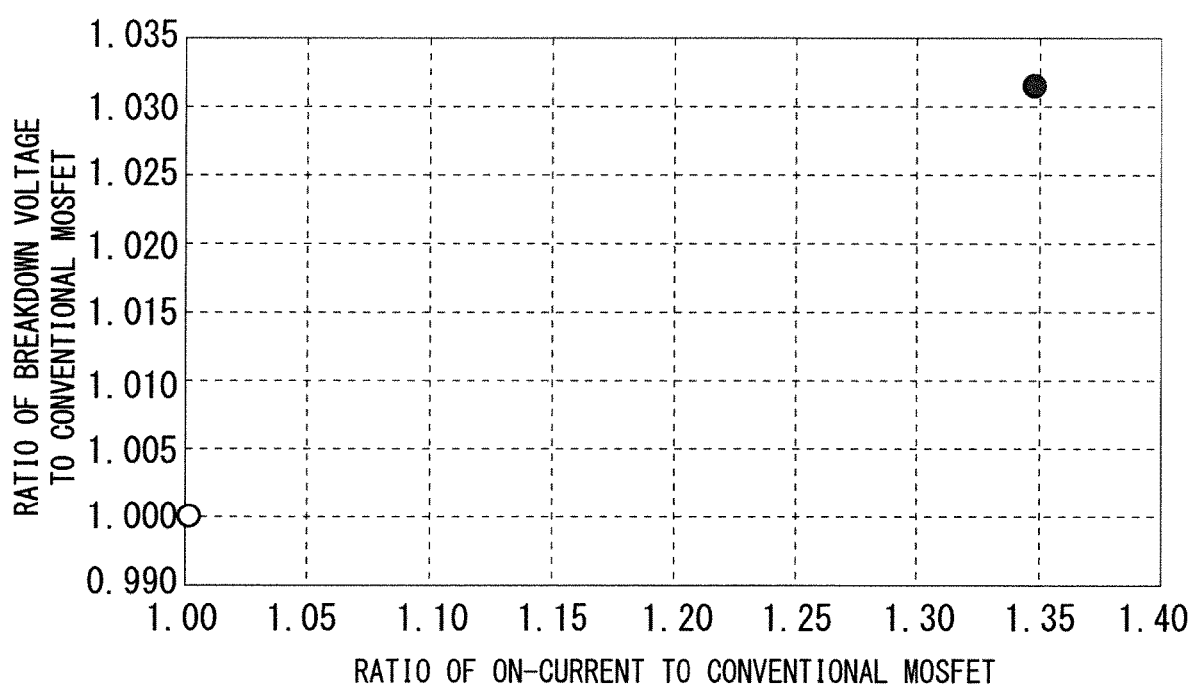

F I G. 1 4
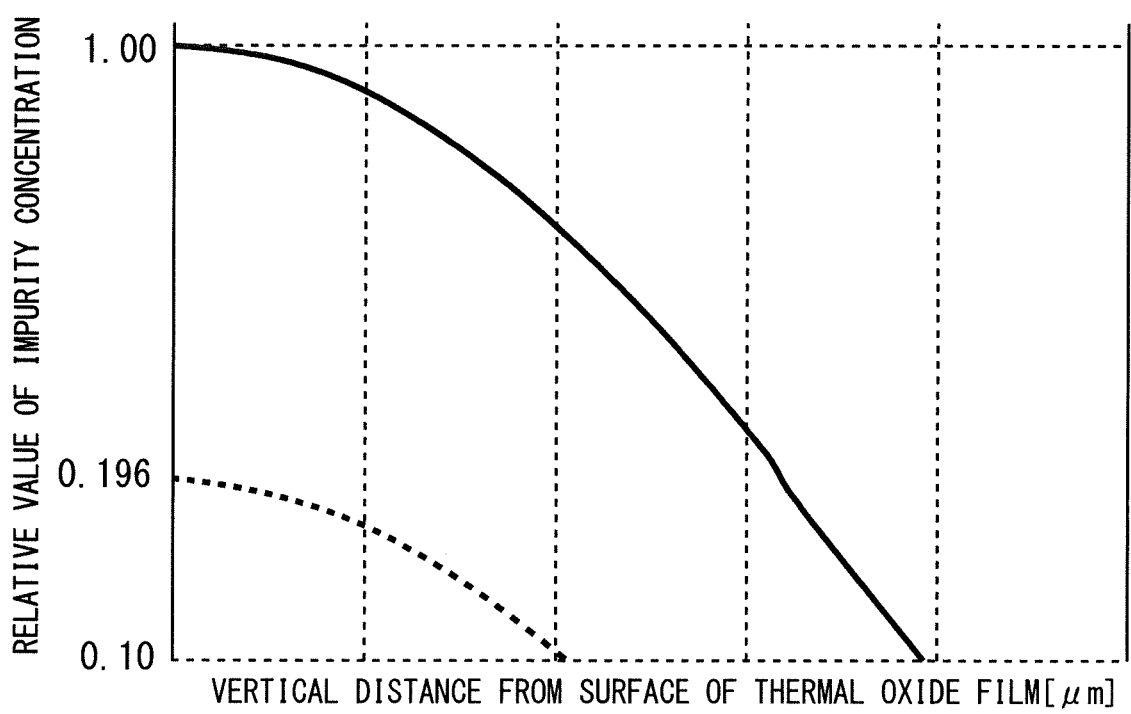

F I G. 2 1
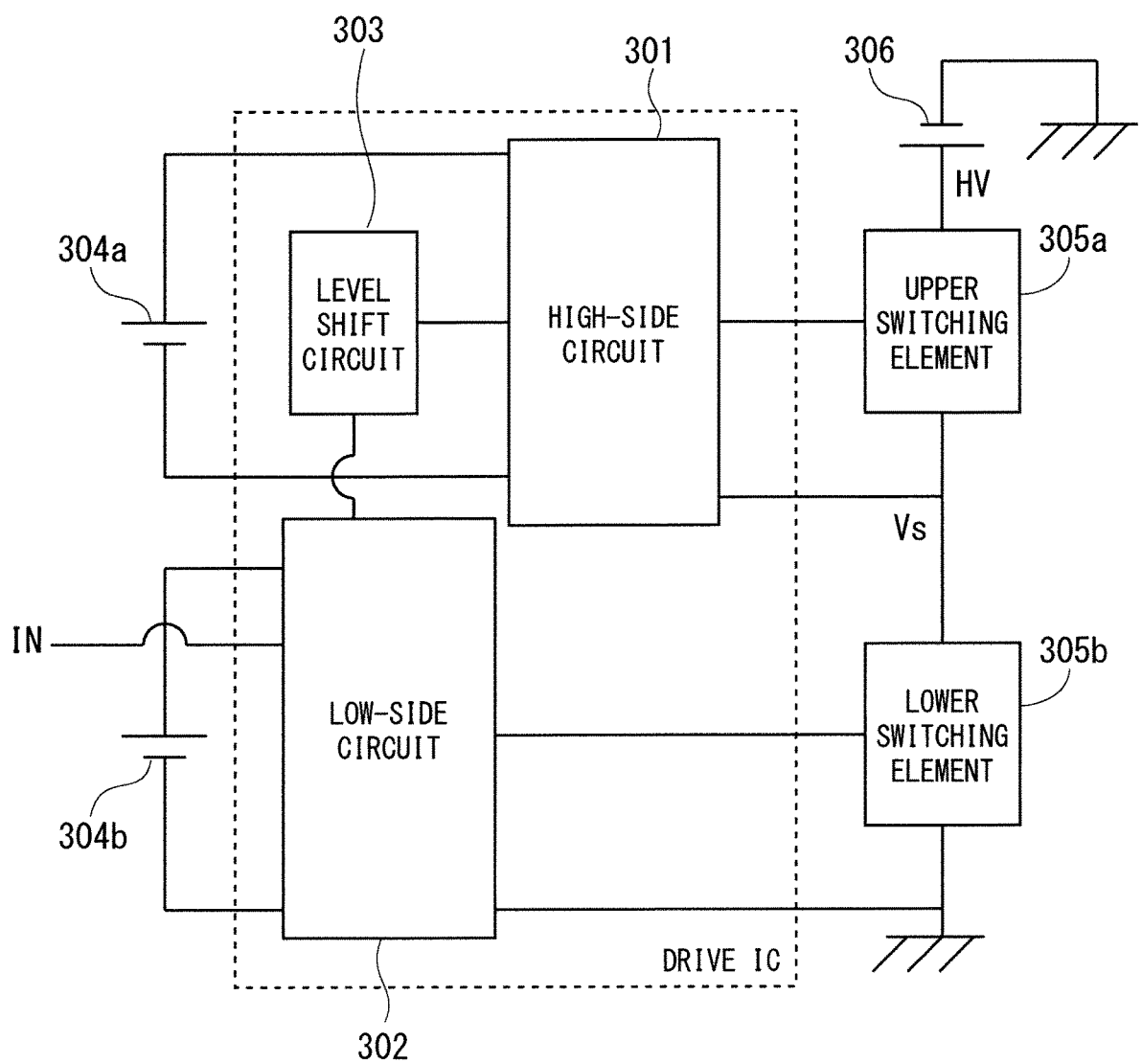

F I G. 2 3
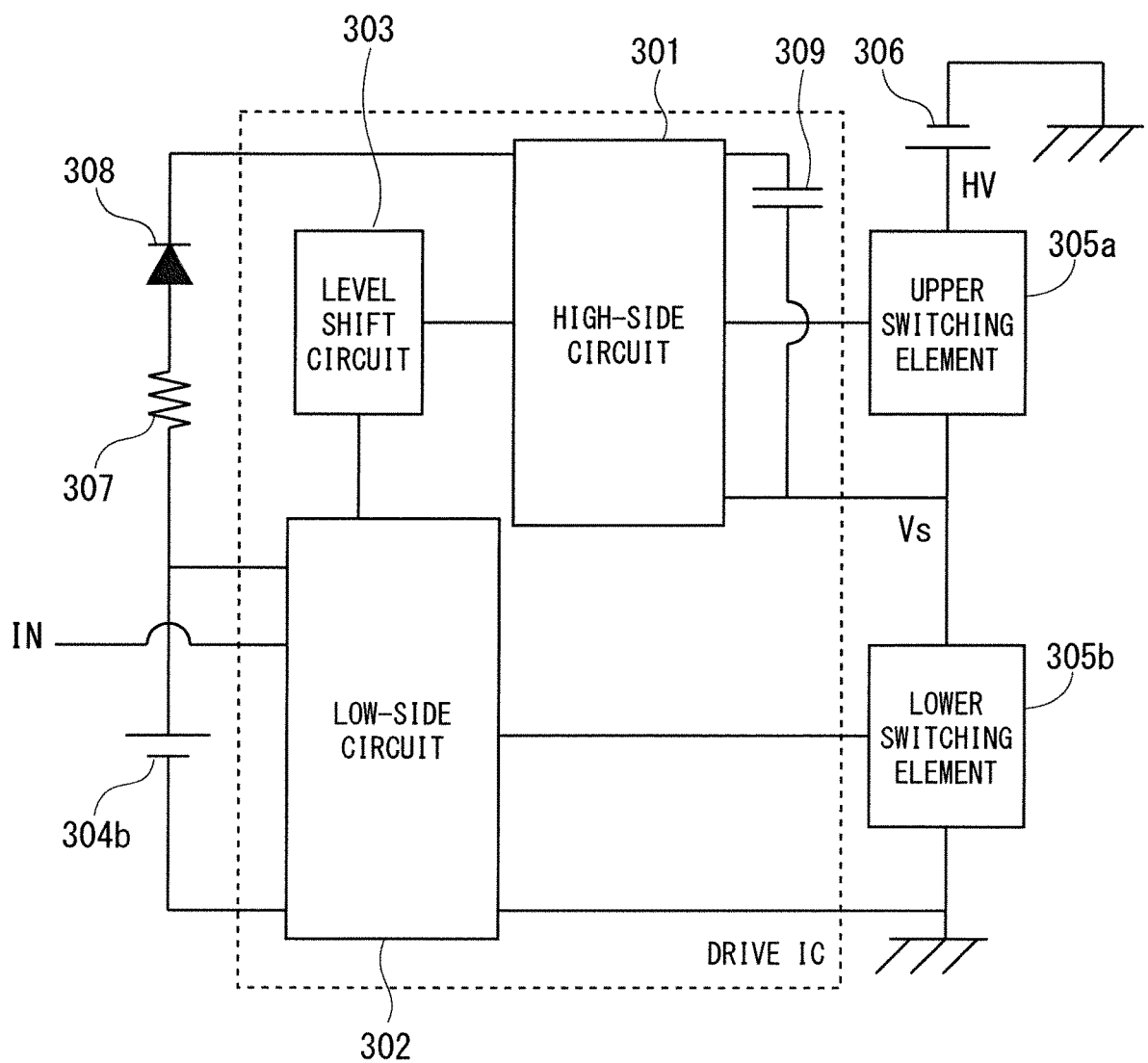

SEMICONDUCTOR DEVICE COMPRISING A MOSFET HAVING A RESURF REGION AND HIGHER PEAK IMPURITY CONCENTRATION DIFFUSION REGION IN THE RESURF REGION

BACKGROUND OF THE INVENTION

Field of the Invention

The present disclosure relates to a semiconductor device including a metal oxide semiconductor field effect transistor (MOSFET).

Description of the Background Art

An integrated circuit (IC) for power control, which is mainly used for driving a gate of a semiconductor device for electric power, typically includes a low-side circuit that operates using a ground (GND) potential as a reference potential, and a high-side circuit that operates using, for example, a potential such as a floating potential, different from the GND potential as a reference potential, and a level shift circuit that transmits a signal between the low-side circuit and the high-side circuit.

There is known a technique in which a low-side circuit region and a high-side circuit region are separated by a reduced surface field (RESURF) region to form a MOSFET constituting a level shift circuit in the RESURF region (e.g., refer to JP 3917211 B2). This MOSFET needs to maintain breakdown voltage equivalent to that of the RESURF region. There is also known a condition of the RESURF region, in which a value of the product of a vertical depth (thickness) t [cm] and an impurity concentration N[cm$^{-3}$] of the RESURF region is limited to enable the RESURF region to maintain high breakdown voltage by being completely depleted when breakdown voltage is maintained (e.g., refer to U.S. Pat. No. 4,292,642 and Philips Journal of Research Vol. 35 No. 1 1980). According to Philips Journal of Research, a condition, N×t<6.9×10$^{11}$ cm$^{-2}$ (hereinafter, this condition is referred to as a "RESURF condition") needs to be satisfied.

Although an IC including a low-side circuit and a high-side circuit requires a power supply for driving each of the low-side circuit and the high-side circuit, there is known a system in which a bootstrap circuit is provided in the IC as a power supply for the high-side circuit. There is also known a technique using a MOSFET formed in a RESURF region, as a high breakdown voltage element in this bootstrap circuit (e.g., refer to JP 5488256 B2).

As described above, the semiconductor device including the RESURF region needs to maintain high breakdown voltage by completely depleting the RESURF region when breakdown voltage is maintained, so that an impurity concentration of the RESURF region is limited. This hinders reduction in on-resistance of the MOSFET formed in the RESURF region. Increasing a length of the RESURF region formed with the MOSFET enables improving breakdown voltage performance of the MOSFET, but accordingly the on-resistance of the MOFET increases. That is, the MOSFET formed in the RESURF region has a trade-off relationship between the improvement of breakdown voltage performance and the reduction in on-resistance.

SUMMARY

The present disclosure is made to solve the above problems, and an object thereof is to improve the trade-off between the improvement of breakdown voltage performance and the reduction in on-resistance of the MOSFET formed in the RESURF region.

A semiconductor device according to the present disclosure includes: a semiconductor substrate formed with a first region of a first conductivity type; a second region that is a RESURF region of a second conductivity type formed in a surface portion of the first region to separate a high-side circuit and a low-side circuit from each other; a third region of the second conductivity type formed at least in a bottom portion of the second region close to the high-side circuit, having a higher peak concentration of impurities than the second region; and a MOSFET using the second region as a drift layer. The MOSFET includes: a fourth region serving as a drain region of the second conductivity type formed in the surface portion of the second region, having a higher peak concentration of impurities than the second region; a sixth region serving as a source region of the second conductivity type formed in a surface portion of a fifth region of the first conductivity type or in a surface portion of the first region, in a region closer to the low-side circuit than the fourth region, the fifth region being provided in the second region; a first thermal oxide film formed on a surface of the second region, in a region between the fourth region and the sixth region; and a seventh region of the second conductivity type formed in a surface portion of the second region below the first thermal oxide film, having a higher peak concentration of impurities than the second region. An end portion of the seventh region close to the low-side circuit is located closer to the low-side circuit than an end portion of the third region close to the low-side circuit.

The semiconductor device according to the present disclosure allows on-resistance of the MOSFET to be reduced by the seventh region, and improves the breakdown voltage performance by dispersing a location where an electric field is concentrated into the third region and the seventh region. This enables improving the trade-off between the improvement of breakdown voltage performance of the MOSFET formed in the RESURF region and the reduction in on-resistance.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a sectional view illustrating structure of a conventional MOSFET;

FIG. 8 is a diagram showing results of simulating a relationship between a lateral length of a seventh region (N-type diffusion layer 14) and breakdown voltage performance for the MOSFET of the first preferred embodiment and the MOSFET of FIG. 4;

FIG. 9 is a diagram showing measurement results of a current value and breakdown voltage during an ON operation for the MOSFET of the first preferred embodiment and the conventional MOSFET;

FIG. 14 is a diagram showing results of simulating impurity concentration distribution in a depth direction of the seventh region (N-type diffusion layer 14);

FIG. 21 is a diagram illustrating a configuration of a drive IC according to a seventh preferred embodiment;

FIG. 23 is a diagram illustrating a modification of the drive IC according to the seventh preferred embodiment;

DESCRIPTION OF THE PREFERRED EMBODIMENTS

First Preferred Embodiment

Figure 1:
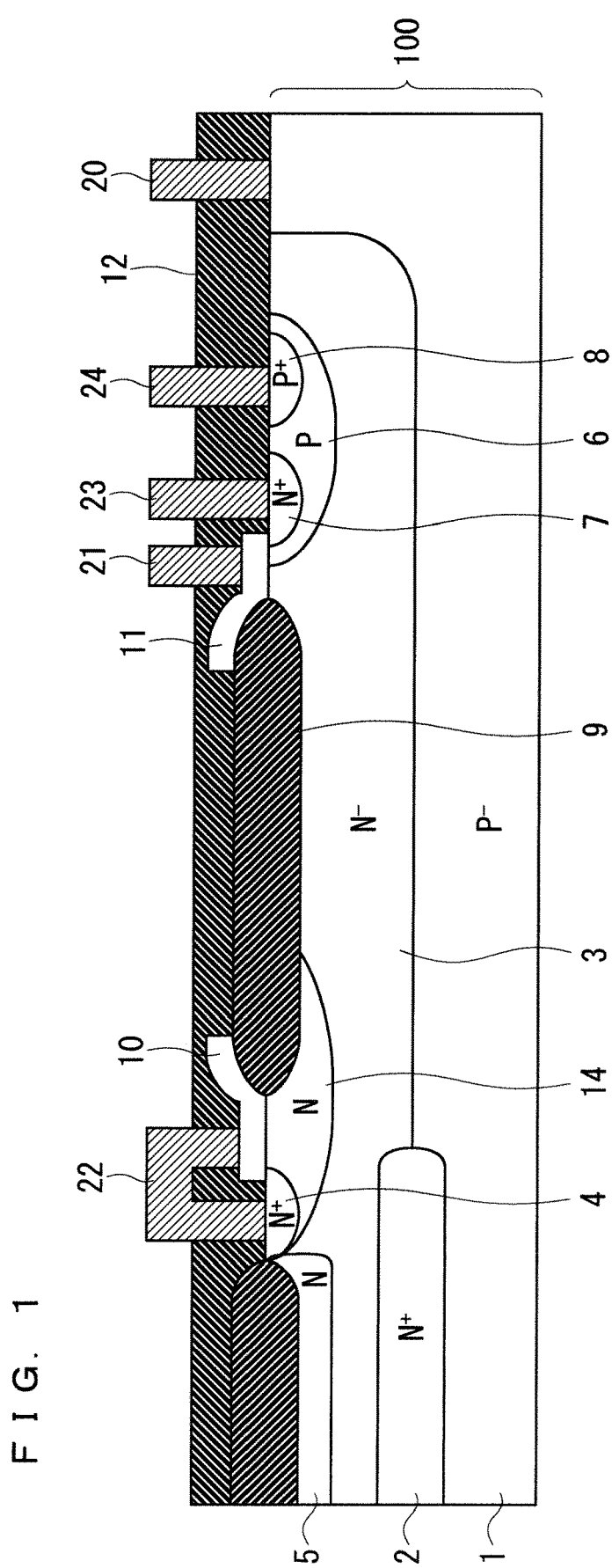
FIG. 1 is a sectional view of a MOSFET formed in a RESURF region of a semiconductor device according to a first preferred embodiment.

FIG. 1 is a sectional view of a lateral high breakdown voltage N-channel MOSFET formed in a RESURF region of a semiconductor device according to a first preferred embodiment. Hereinafter, unless otherwise specified, a "MOSFET" refers to a lateral MOSFET formed in a RESURF region. Then, the left side direction in FIG. 1 is defined as the inside of the semiconductor device, and the right side direction is defined as the outside of the semiconductor device. In the following description, a first conductivity type is a P-type and a second conductivity type is an N-type. However, conversely, the first conductivity type may be the N type and the second conductivity type may be the P type.

The semiconductor device according to the first preferred embodiment is formed using a semiconductor substrate 100 of the P-type, formed with a P-type diffusion layer 1 as a first region. The semiconductor substrate 100 is formed with respective regions described below, and in the following description, a P-type region of the semiconductor substrate 100 that remains other than these formed regions is referred to as the "P-type diffusion layer 1". Here, although the semiconductor substrate 100 is made of silicon (Si), a wide band gap semiconductor made of silicon carbide (SiC), gallium nitride (GaN), or the like may be used. A semiconductor device using the wide band gap semiconductor is superior in operation at high voltage, large current, and high temperature to a conventional semiconductor device using silicon.

The semiconductor substrate 100 includes a surface portion formed with an N-type diffusion layer 3 as a second region. Although not illustrated in FIG. 1, a high-side circuit is formed inside the N-type diffusion layer 3, and a low-side circuit is formed outside the N-type diffusion layer 3. Then, the N-type diffusion layer 3 functions as a RESURF region that separates the high-side circuit and the low-side circuit from each other. That is, when the N-type diffusion layer 3 has an impurity concentration indicated as N [$cm^{-3}$] and a depth indicated as t [cm], the condition, $N \times t < 6.9 \times 10^{11}$ $cm^{-2}$, i.e., the RESURF condition, is satisfied.

The N-type diffusion layer 3 is provided in at least its inner bottom portion (close to the high-side circuit) with an N-type buried diffusion layer 2 having a higher peak concentration of impurities than that of the N-type diffusion layer 3, as a third region. The N-type buried diffusion layer 2 achieves not only an effect of suppressing vertical parasitic operation of elements in the high-side circuit, but also an effect of preventing operation of the elements in the high-side circuit from being adversely affected by allowing a depletion layer in the N-type diffusion layer 3 to extend into the high-side circuit when the breakdown voltage is maintained.

The semiconductor device according to the first preferred embodiment includes a lateral high breakdown voltage N-channel MOSFET having the N-type diffusion layer 3 as a drift layer. Structure of the MOSFET will be described below.

The N-type diffusion layer 3 includes a surface portion formed with an N-type diffusion layer 4 as a fourth region and a P-type diffusion layer 6 as a fifth region. The N-type diffusion layer 4 has a higher peak concentration of impurities than the N-type diffusion layer 3 and serves as a drain region of the MOSFET. The P-type diffusion layer 6 includes a surface portion formed with an N-type diffusion layer 7 as a sixth region and a P-type diffusion layer 8 having a higher peak concentration of impurities than the P-type diffusion layer 6. The N-type diffusion layer 7 serves as a source region of the MOSFET. The P-type diffusion layer 6 serves as a back gate of the MOSFET, and the P-type diffusion layer 8 serves as a contact region for electrically connecting the P-type diffusion layer 6 and a back gate electrode 24 described later.

The N-type diffusion layer 3 has a surface between the N-type diffusion layer 4 and the P-type diffusion layer 6 (i.e., between the N-type diffusion layer 4 and the N-type diffusion layer 7), and a surface inside of the N-type diffusion layer 4, the surfaces each being formed with a thermal oxide film 9. The thermal oxide film 9 between the N-type diffusion layer 4 and the P-type diffusion layer 6 serves as a first thermal oxide film, and the thermal oxide film 9 inside the N-type diffusion layer 4 serves as a second thermal oxide film.

The N-type diffusion layer 3 includes a surface portion below the thermal oxide film 9 between the N-type diffusion layer 4 and the P-type diffusion layer 6, the surface portion being formed with an N-type diffusion layer 14 having a higher peak concentration of impurities than the N-type diffusion layer 3, as a seventh region. The N-type diffusion layer 14 does not satisfy the RESURF condition. That is, when the N-type diffusion layer 14 has an impurity concentration indicated as N [$cm^{-3}$] and a depth indicated as t [cm], a relationship, $N \times t > 6.9 \times 10^{11}$ $cm^{-2}$, is satisfied. The N-type diffusion layer 14 has an outer end portion, located closer to the low-side circuit than an outer end portion of the N-type buried diffusion layer 2. That is, the N-type diffusion layer 14 extends outward of the N-type buried diffusion layer 2. Although the N-type diffusion layer 14 may be in contact with the N-type buried diffusion layer 2, the N-type diffusion layer 14 is here housed in the N-type diffusion layer 3, and the N-type diffusion layer 14 and the N-type buried diffusion layer 2 are separated from each other. Although the N-type diffusion layer 14 is formed overlapping the N-type diffusion layer 4 in FIG. 1, the layers may not overlap each other.

Below the thermal oxide film 9 inside the N-type diffusion layer 4, an N-type diffusion layer 5 is formed as an eighth region to prevent field inversion. This N-type diffusion layer 5 may be eliminated.

The thermal oxide film 9 between the N-type diffusion layer 4 and the P-type diffusion layer 6 has an inner end portion covered with a polysilicon layer 10 as a first polysilicon layer. The thermal oxide film 9 has an outer end portion covered with a polysilicon layer 11 as a second polysilicon layer. The polysilicon layer 11 extends from the end portion on the outside of the thermal oxide film 9 between the N-type diffusion layer 4 and the P-type diffusion layer 6 to above the N-type diffusion layer 7 to cover surfaces of the N-type diffusion layer 3 and the P-type diffusion layer 6 in a region between the thermal oxide film 9 and the N-type diffusion layer 7.

The semiconductor substrate 100 has a surface formed with an insulating film 12. On the insulating film 12, a reference potential electrode 20 for fixing a potential of the P-type diffusion layer 1 to a reference potential, and a gate electrode 21, a source electrode 23, a drain electrode 22, and a back gate electrode 24 of the MOSFET, are each formed partially embedded in the insulating film 12. The reference potential electrode 20 is connected to the P-type diffusion layer 1. The gate electrode 21 is provided on the polysilicon layer 11 and faces a surface of the P-type diffusion layer 8 in a region between the N-type diffusion layer 7 and the N-type diffusion layer 3. During an ON operation of the MOSFET, a channel is formed in the P-type diffusion layer 8 below the gate electrode 21. The source electrode 23 is connected to the N-type diffusion layer 7 serving as the source region of the MOSFET. The drain electrode 22 is connected to the N-type diffusion layer 4 serving as the drain region of the MOSFET, and partly reaches an upper surface of the polysilicon layer 10. The back gate electrode 24 is connected to the P-type diffusion layer 8, and is electrically connected to the P-type diffusion layer 6 serving as a back gate through the P-type diffusion layer 8.

The semiconductor device according to the first preferred embodiment has characteristics in which the N-type buried diffusion layer 2 and the N-type diffusion layer 14 are provided, and the N-type diffusion layer 14 has the outer end portion (close to the low side circuit), located closer to the low-side circuit than the outer end portion of the N-type buried diffusion layer 2. Hereinafter, effects obtained by the characteristics will be described below.

The conventional semiconductor device has a structure without the N-type buried diffusion layer 2 and the N-type diffusion layer 14, as illustrated in FIG. 2. The semiconductor device of FIG. 2 is configured such that a depletion layer extends from a PN junction between the N-type diffusion layer 3 and the P-type diffusion layer 1 when the breakdown voltage is maintained with the drain electrode 22 to be at a high potential. At this time, the N-type diffusion layer 3 is completely depleted by a RESURF effect, thereby achieving high breakdown voltage of the MOSFET.

Figure 3:
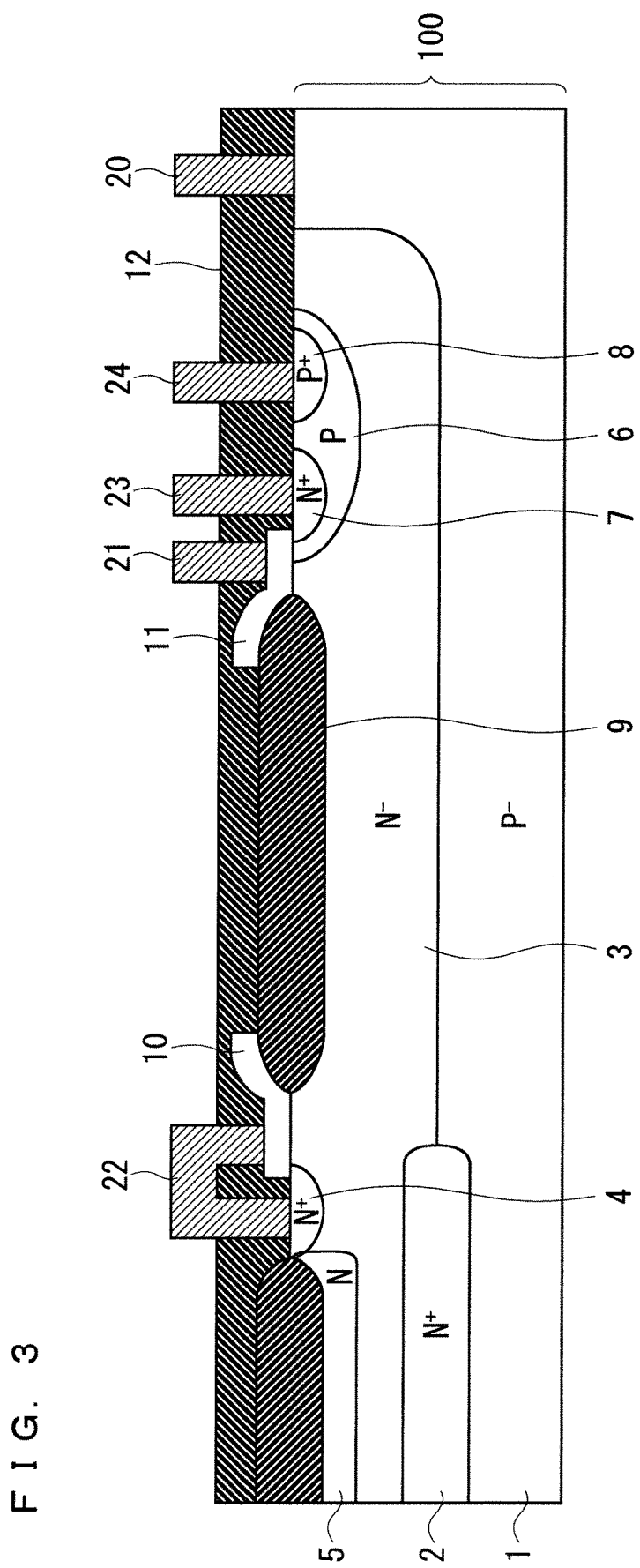
FIG. 3 is a diagram illustrating structure in which a third region (N-type buried diffusion layer 2) is added to a conventional MOSFET.

For example, when the semiconductor device of FIG. 2 is provided with the N-type buried diffusion layer 2 being the third region as illustrated in FIG. 3, the semiconductor device can obtain not only an effect of suppressing vertical parasitic operation of elements in the high-side circuit, but, also an effect of preventing operation of the elements in the high-side circuit from being adversely affected by a depletion layer when the breakdown voltage is maintained, as described above. However, when the breakdown voltage is maintained, the N-type buried diffusion layer 2 is not completely depleted. Thus, an electric field is concentrated in the N-type buried diffusion layer 2, so that breakdown voltage performance of the MOSFET deteriorates.

Figure 4:
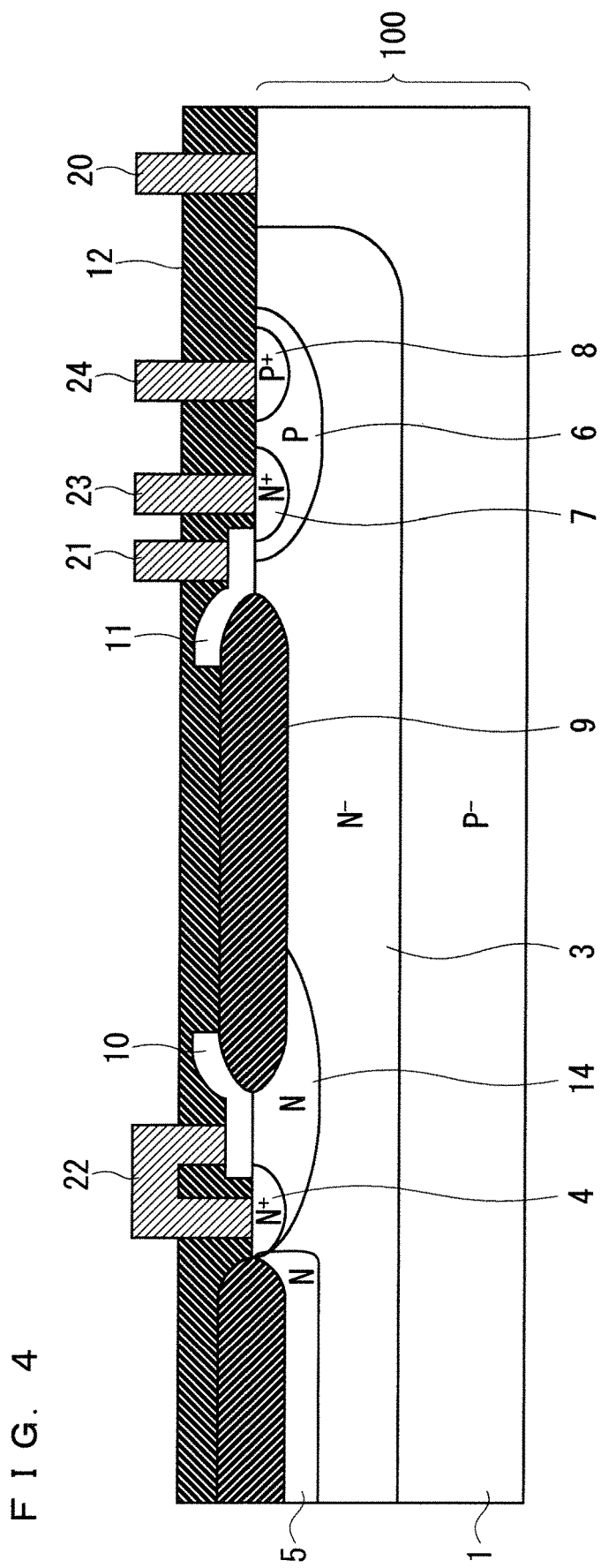
FIG. 4 is a diagram illustrating structure in which a seventh region (N-type diffusion layer 14) is added to a conventional MOSFET.

For example, when the semiconductor device of FIG. 2 is provided with the N-type diffusion layer 14 being the seventh region as illustrated in FIG. 4, increasing the N-type diffusion layer 14 in depth in a vertical direction (a direction perpendicular to a surface of the N-type diffusion layer 3) and in length in a lateral direction (a direction from the high-side circuit toward the low-side direction) enables reducing on-resistance of the MOSFET. However, when the breakdown voltage is maintained, an electric field concentrates on the end portion of the N-type diffusion layer 14. Thus, the breakdown voltage performance deteriorates as the N-type diffusion layer is increased in depth and length. That is, there is a trade-off relationship between the effect of reducing the on-resistance of the MOSFET using the N-type diffusion layer 14 and the breakdown voltage performance of the MOSFET.

In contrast, the semiconductor device according to the first preferred embodiment is configured such that both of the N-type buried diffusion layer 2 and the N-type diffusion layer 14 are formed in the N-type diffusion layer 3. In this case, the N-type diffusion layer 14 reduces the on-resistance of the MOSFET, and electric field concentration occurs in both the N-type buried diffusion layer 2 and the N-type diffusion layer 14. Thus, locations where the electric field concentration occurs are dispersed to improve the breakdown voltage performance of the MOSFET. As a result, the trade-off between the breakdown voltage performance and the on-resistance is improved as compared with the semiconductor devices of FIGS. 2 to 4.

However, when the N-type diffusion layer 14 has a short length, the electric field is not remarkably concentrated in the N-type diffusion layer 14. Thus, the electric field is not dispersed into the N-type buried diffusion layer 2 and the N-type diffusion layer 14 to increase strength of the electric field generated in the N-type buried diffusion layer 2, so that the above effect cannot be sufficiently obtained. For this reason, the semiconductor device of the first preferred embodiment is configured such that the N-type diffusion layer 14 is increased in length to allow the outer end portion of the N-type diffusion layer 14 to be located outside the outer end portion of the N-type buried diffusion layer 2, thereby allowing the electric field to be also concentrated in the N-type diffusion layer 14. The breakdown voltage performance is most improved in the first embodiment under conditions where the N-type buried diffusion layer 2 has a maximum electric field strength equal to a maximum electric field strength in the N-type diffusion layer 14 when the breakdown voltage is maintained.

Figure 5:
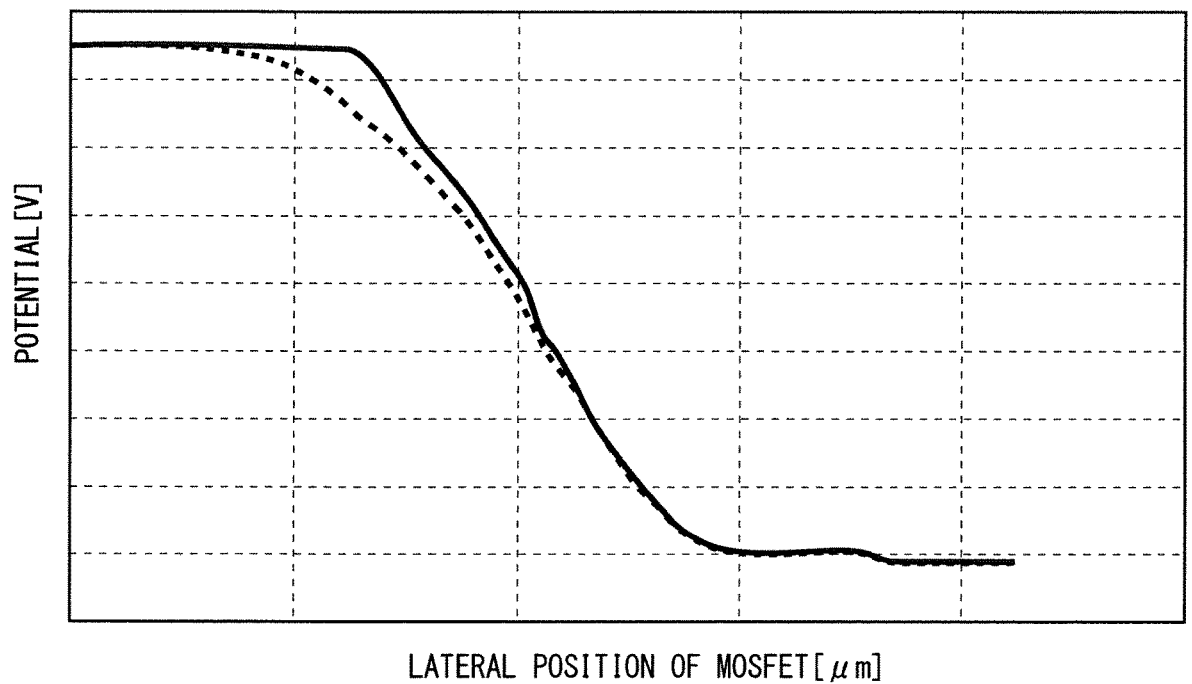
FIG. 5 is a diagram showing results of simulating horizontal potential distribution near a surface of a semiconductor substrate for the MOSFET of the first preferred embodiment and the conventional MOSFET when breakdown voltage is maintained.

FIG. 5 shows results of simulating horizontal potential distribution near a surface of the semiconductor substrate 100 for the MOSFET of the first preferred embodiment and the conventional MOSFET when the breakdown voltage is maintained. FIG. 5 includes the solid line graph showing the potential distribution of the MOSFET of the first embodiment, and the broken line graph showing the potential distribution of the conventional MOSFET. The solid line graph shows a flat region in its left end portion that corresponds to the N-type diffusion layer 14. As shown in FIG. 5, the MOSFET of the first preferred embodiment includes the N-type diffusion layer 14 with a high impurity concentration, so that the N-type diffusion layer 14 has a higher potential than that of the conventional MOSFET. From this, it turns out that the MOSFET of the first preferred embodiment has the electric field that is concentrated not only in the N-type buried diffusion layer 2 but also in the N-type diffusion layer 14 when the breakdown voltage is maintained.

Figure 6:
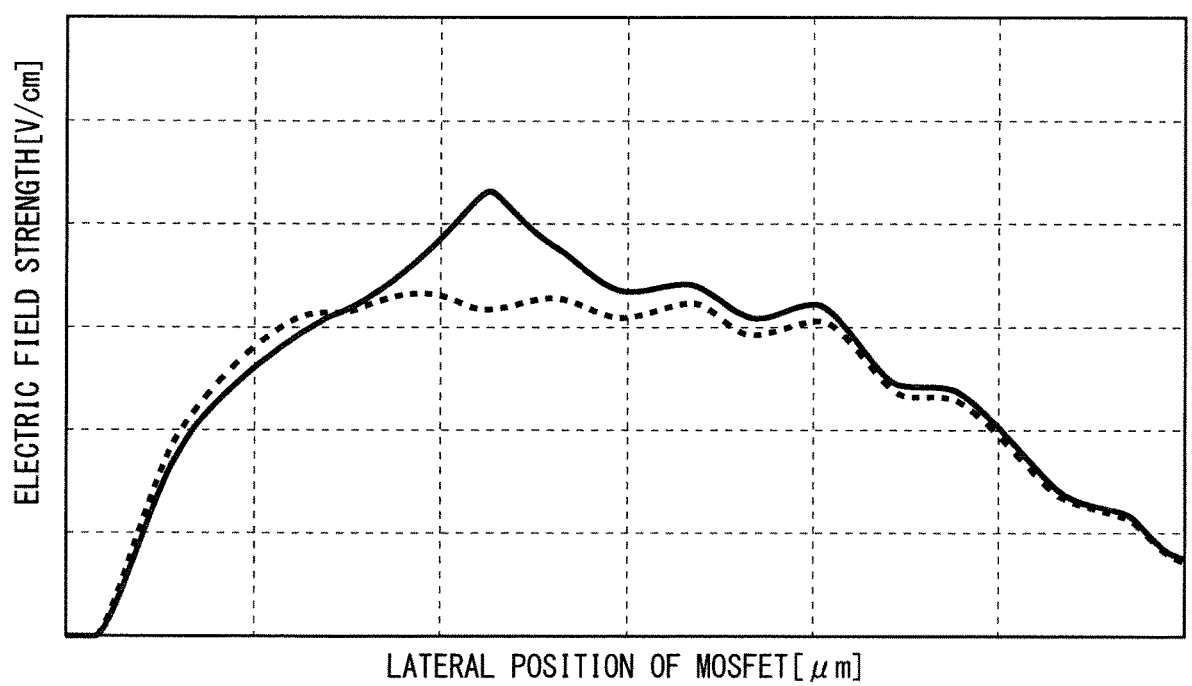
FIG. 6 is a diagram showing results of simulating horizontal electric field distribution near a surface of a semiconductor substrate for the MOSFET of the first preferred embodiment and the conventional MOSFET when breakdown voltage is maintained.
Figure 7:
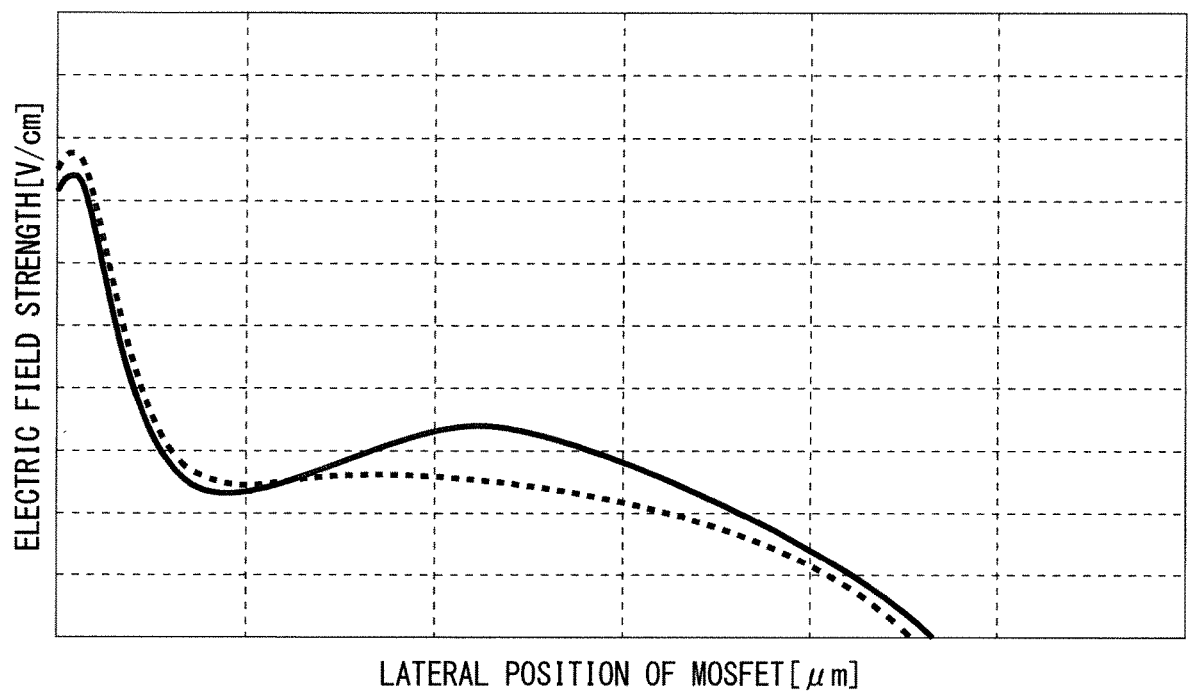
FIG. 7 is a diagram showing results of simulating horizontal electric field distribution in a portion at a depth at which the electric field is to be maximum near the third region (N-type buried diffusion layer 2) of the MOSFET of the first preferred embodiment, for the MOSFET of the first preferred embodiment and the conventional MOSFET.

FIG. 6 shows results of simulating horizontal electric field distribution near the surface of the semiconductor substrate 100 for the MOSFET of the first preferred embodiment and the conventional MOSFET when the breakdown voltage is maintained. FIG. 7 shows results of simulating horizontal electric field distribution in a portion at a depth at which the electric field is to be maximum near the N-type buried diffusion layer 2 of the MOSFET of the first preferred embodiment, for the MOSFET of the first preferred embodiment and the conventional MOSFET. FIGS. 6 and 7 each includes the solid line graph showing electric field distribution of the MOSFET of the first preferred embodiment, and the broken line graph showing the electric field distribution of the conventional MOSFET. The respective simulations of FIGS. 5 to 7 are all identical in bias potential that is set when breakdown voltage is maintained.

FIG. 6 shows the graph of the MOSFET of the first preferred embodiment in which a peak of the electric field strength appears in a portion that corresponds to the outer end portion of the N-type diffusion layer 14. When the electric field is concentrated in the outer end portion of the N-type diffusion layer 14 as described above, the MOSFET of the first preferred embodiment has a lower maximum value of the electric field than the conventional MOSFET as shown in FIG. 7. This enables the MOSFET of the first preferred embodiment to have higher breakdown voltage performance than the conventional MOSFET.

FIG. 8 shows results of simulating a relationship between a lateral length of the N-type diffusion layer 14 and breakdown voltage performance for the MOSFET of the first preferred embodiment and the conventional MOSFET including the N-type diffusion layer 14 (FIG. 4). FIG. 8 includes the solid line graph showing breakdown voltage characteristics of the MOSFET of the first preferred embodiment, and the broken line graph showing breakdown voltage characteristics of the MOSFET of FIG. 4. The MOSFET of the first preferred embodiment including both the N-type buried diffusion layer 2 and the N-type diffusion layer 14 has an improved trade-off between breakdown voltage performance and on-resistance as compared with the MOSFET of FIG. 4 including only the N-type diffusion layer 14.

FIG. 9 is a diagram showing measurement results of a current value and breakdown voltage during an ON operation for the MOSFET of the first preferred embodiment and the conventional MOSFET. FIG. 9 shows a black dot that is a measurement result of the MOSFET of the first embodiment, and a white dot that is a measurement result of the conventional MOSFET. FIG. 9 shows a graph with a vertical axis and a horizontal axis that are normalized by measured values of the conventional MOSFET. The MOSFET of the first embodiment is improved in breakdown voltage performance and reduced in on-resistance as compared with the conventional MOSFET, so that a tendency as in the above simulation results is found.

As described above, the semiconductor device according to the first preferred embodiment enables improving the trade-off between the reduction in the on-resistance and the improvement of the breakdown voltage performance in the MOSFET including the N-type diffusion layer 3 serving as a drift layer by providing both the N-type buried diffusion layer 2 (second region) having a higher impurity peak concentration than the RESURF region, and the N-type diffusion layer 14 (seventh region), in the N-type diffusion layer 3 serving as the RESURF region.

Second Preferred Embodiment

Figure 10:
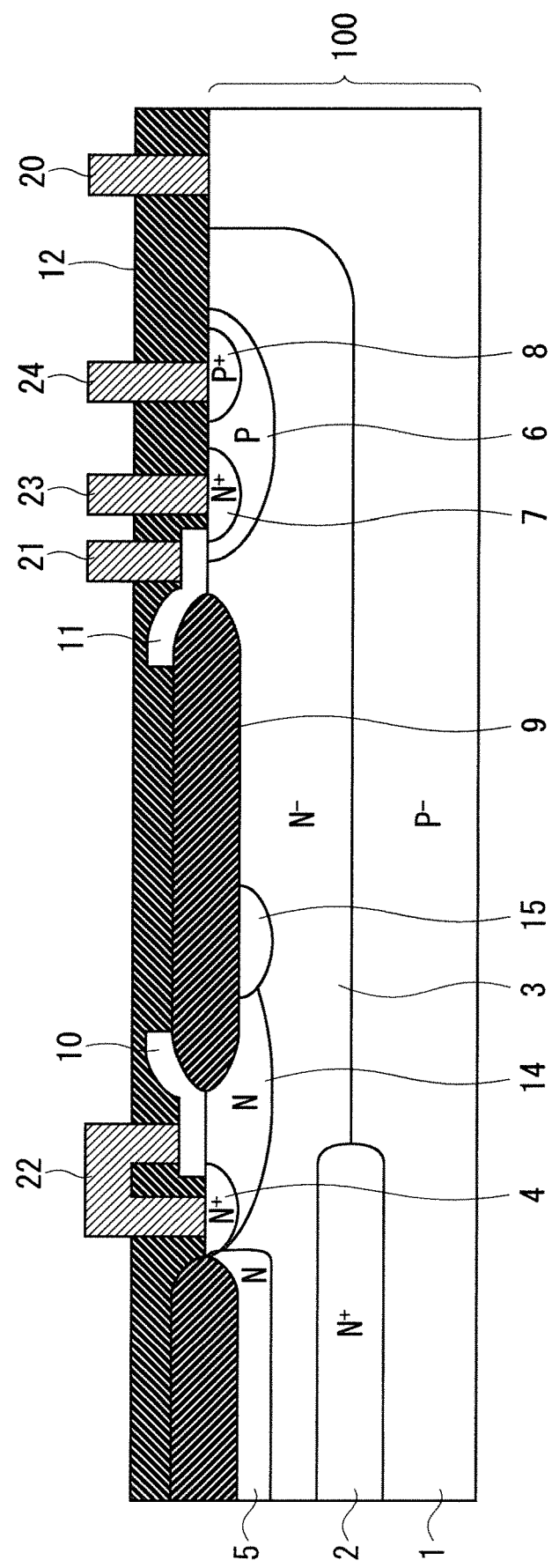
FIG. 10 is a sectional view of a MOSFET formed in a RESURF region of a semiconductor device according to a second preferred embodiment.

FIG. 10 is a sectional view of a MOSFET formed in a RESURF region of a semiconductor device according to a second preferred embodiment. FIG. 10 is different from FIG. 1 in structure in which an N-type diffusion layer 15 having a peak concentration of impurities that is lower than that of an N-type diffusion layer 14 and higher than that of an N-type diffusion layer 3 is provided as a ninth region outside (close to the low-side circuit) the N-type diffusion layer 14 being the seventh region.

When the MOSFET of the second preferred embodiment includes the N-type diffusion layer 15, an impurity concentration of a drift layer partially increases to higher than that of the MOSFET of the first preferred embodiment. Thus, the MOSFET of the second preferred embodiment has a lower on-resistance than that of the first preferred embodiment.

The N-type diffusion layer 15 has a lower impurity concentration than the N-type diffusion layer 14, and thus is liable to be depleted. Thus, disposing the N-type diffusion layer 15 enables suppressing concentration of an electric field when breakdown voltage is maintained. This enables breakdown voltage performance to be improved as compared with the first preferred embodiment.

As described above, the second preferred embodiment enables more effects of reducing the on-resistance of the MOSFET and improving the breakdown voltage performance to be obtained as compared with the first embodiment. Thus, a trade-off between the reduction in the on-resistance and the improvement of the breakdown voltage performance in the MOSFET can be further improved as compared with the first preferred embodiment.

The N-type diffusion layer 15 may have an uneven distribution of the impurity concentration, and thus may have an outer end portion with a concentration lower than that in an inner portion, for example. In that case, the N-type diffusion layer 15 may be formed overlapping the N-type diffusion layer 14, and the N-type diffusion layer 15 may be formed overlapping the entire N-type diffusion layer 14, for example. In other words, the N-type diffusion layer 14 may have a distribution of the impurity concentration in which the outer end portion has a lower concentration than the inner portion.

Figure 11:
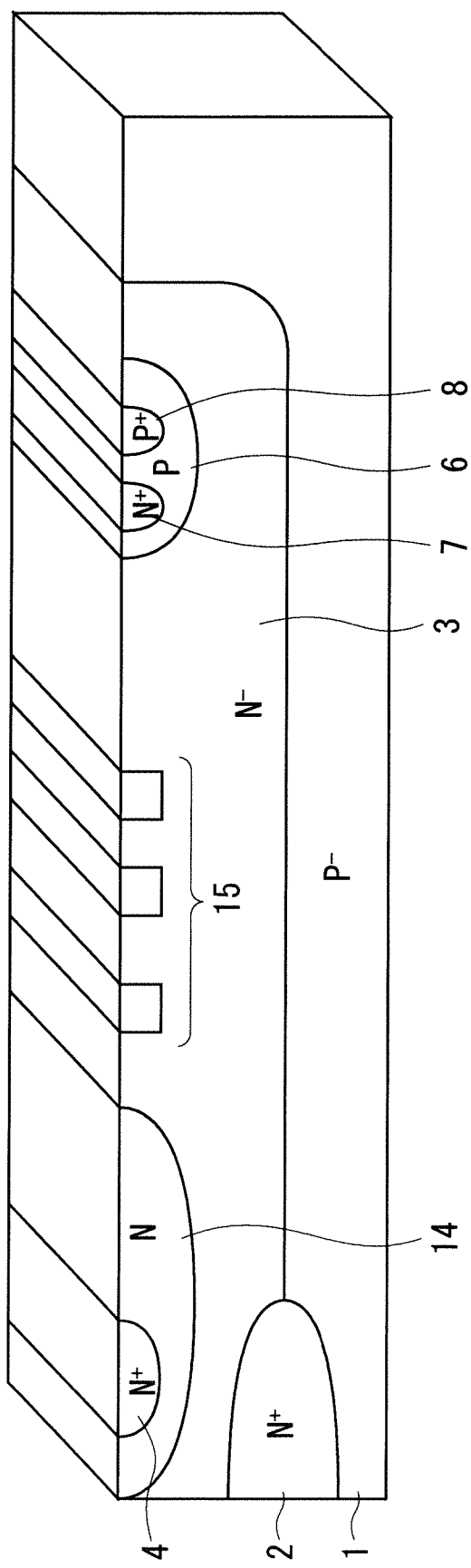
FIGS. 11 and 12 are each a diagram illustrating an example of structure of an N-type diffusion layer 15.
Figure 12:
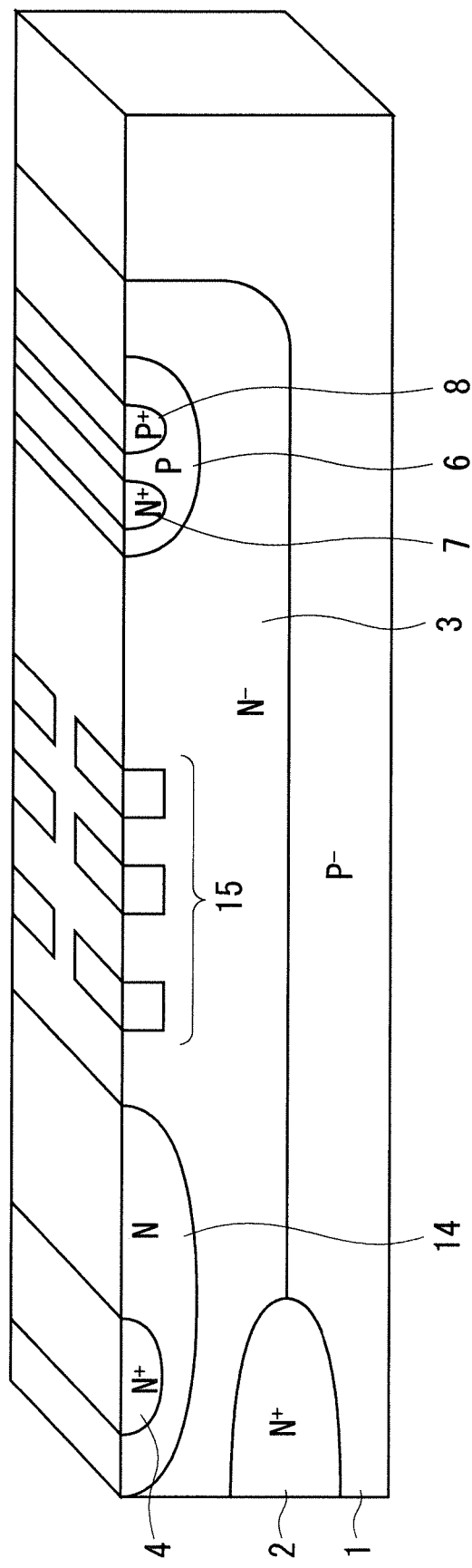

Although the N-type diffusion layer 15 is one integrated region in FIG. 10, the N-type diffusion layer 15 may be composed of a plurality of discretely formed regions. For example, the N-type diffusion layer 15 may be composed of a plurality of line-shaped regions as in a perspective view of FIG. 11, or the N-type diffusion layer 15 may be composed of a plurality of dot-shaped regions as in a perspective view of FIG. 12. In this case, each of the plurality of regions constituting the N-type diffusion layer 15 has an impurity concentration that can be adjusted using a pattern shape including size or an interval of lines or dots (see FIG. 14 described later). Thus, when the N-type diffusion layer 15 is composed of a plurality of discrete regions, the N-type diffusion layer 14 and the N-type diffusion layer 15 can be collectively formed in the same impurity implantation step. In that case, each of the plurality of regions constituting the N-type diffusion layer 15 has an impurity concentration equal to or lower than that of the N-type diffusion layer 14.

Third Preferred Embodiment

Figure 13:
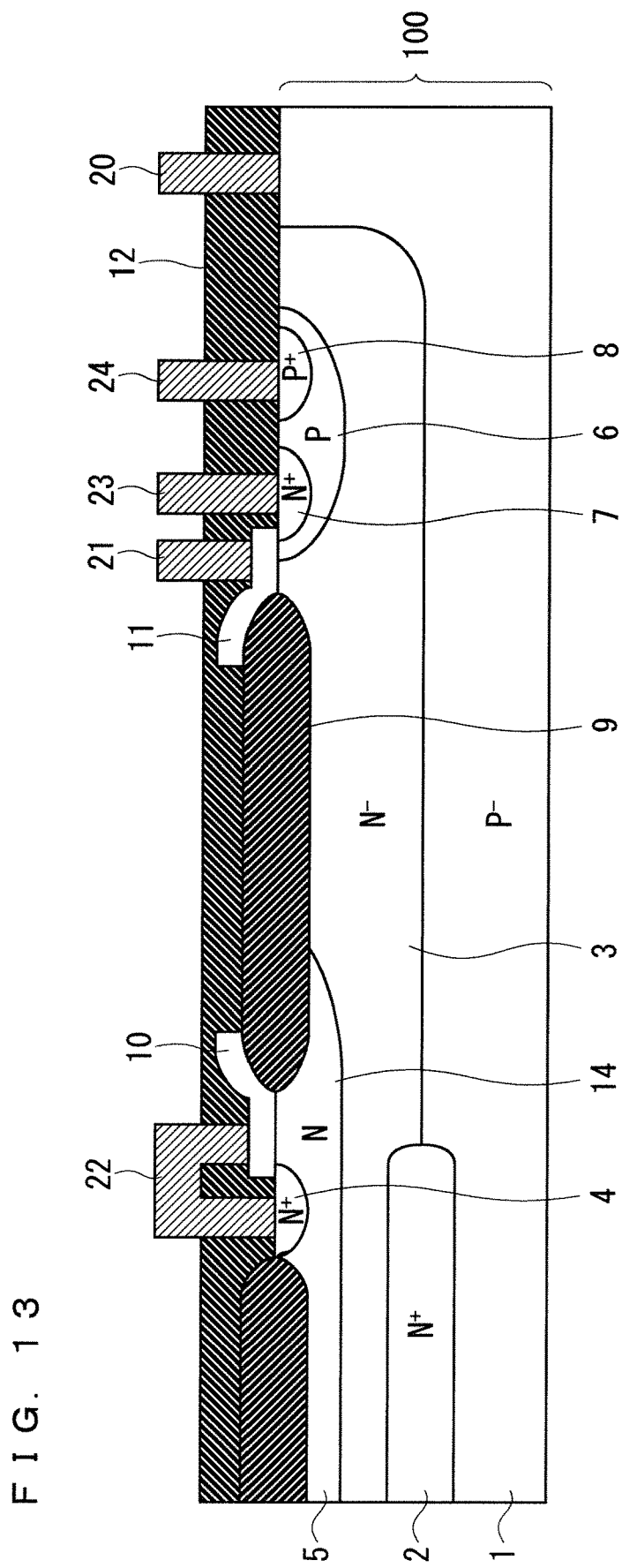
FIG. 13 is a sectional view of a MOSFET formed in a RESURF region of a semiconductor device according to a third preferred embodiment.

FIG. 13 is a sectional view of a MOSFET formed in a RESURF region of a semiconductor device according to a third preferred embodiment. The third preferred embodiment includes an N-type diffusion layer 14 being a seventh region provided below the thermal oxide film 9 in a region between an N-type diffusion layer 4 and a P-type diffusion layer 6, and an N-type diffusion layer 5 being an eighth region provided below the thermal oxide film 9 inside the N-type diffusion layer 4, the layers being formed in the same impurity implantation step. Although FIG. 13 illustrates the N-type diffusion layer 14 and the N-type diffusion layer 5 that are connected, the layers may be separated from each other.

The present embodiment allows the N-type diffusion layer 14 and the N-type diffusion layer 5 to be formed in the same impurity implantation step, so that the N-type diffusion layer 5 has an impurity concentration that is basically equal to an impurity concentration of the N-type diffusion layer 14. However, the N-type diffusion layer 14 and the N-type diffusion layer 5 may be different from each other in impurity concentration by forming the N-type diffusion layer 14 or the N-type diffusion layer 5 from a plurality of discrete regions as with the N-type diffusion layer 15 of the second preferred embodiment. When the N-type diffusion layer 5 has an impurity concentration indicated as N1 and the N-type diffusion layer 14 has an impurity concentration indicated as N2, a relationship, $0.1 \times N1 < N2 < 2 \times N1$, is preferably satisfied.

FIG. 14 shows results of simulating impurity concentration distribution in a depth direction of the N-type diffusion layer 14. FIG. 14 includes the solid line graph showing distribution when an implantation mask with a sufficiently large opening is used in the impurity implantation step of forming the N-type diffusion layer 14, and the broken line graph showing distribution when the implantation mask has an opening in a size of 0.5 μm. FIG. 14 shows the graph with a horizontal axis representing a vertical distance from a surface of the thermal oxide film 9, and a vertical axis representing a relative value (value normalized by a peak value of the solid line graph) of an impurity concentration of the N-type diffusion layer 14. When the opening of the implantation mask has a size of 0.5 μm, the impurity concentration can be reduced to about ⅕ of a size of the opening of the implantation mask that is sufficiently large. As described above, the impurity concentrations of the N-type diffusion layer 14 and the N-type diffusion layer 5 can be controlled by adjusting the size of the opening of the implantation mask, i.e., the size of the impurity implantation region.

As in the third preferred embodiment, the N-type diffusion layer 14 and the N-type diffusion layer 5 can be formed in the same impurity implantation step. This enables reduction in the number of impurity implantation steps, so that a manufacturing step of the semiconductor device can be simplified. The third preferred embodiment may be combined with the second preferred embodiment.

Fourth Preferred Embodiment

Figure 15:
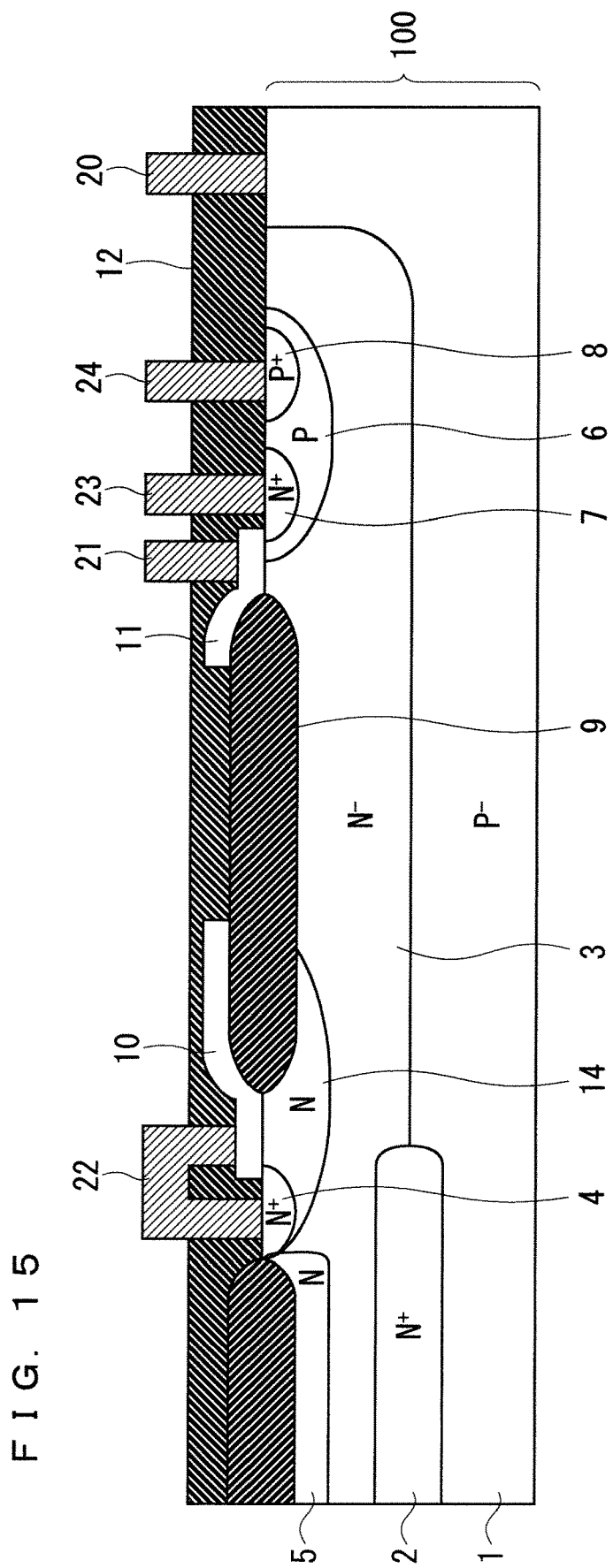
FIG. 15 is a sectional view of a MOSFET formed in a RESURF region of a semiconductor device according to a fourth preferred embodiment.

FIG. 15 is a sectional view of a MOSFET formed in a RESURF region of a semiconductor device according to a fourth preferred embodiment. The MOSFET of the fourth preferred embodiment is configured such that a polysilicon layer 10, being a first polysilicon layer covering an inner end portion of a thermal oxide film 9 in a region between an N-type diffusion layer 4 and a P-type diffusion layer 6, has an outer end portion (close to the low-side circuit) that is located closer to a low-side circuit than an outer end portion of an N-type diffusion layer 14 formed below the thermal oxide film 9. That is, the polysilicon layer 10 extends more outward than the N-type diffusion layer 14.

The N-type diffusion layer 14 has a higher impurity concentration than an N-type diffusion layer 3 serving as a RESURF region, so that the N-type diffusion layer 14 has a small voltage drop when breakdown voltage is maintained and high voltage is applied to a drain electrode 22 as shown in FIG. 5, and thus the N-type diffusion layer 14 has a higher potential than the N-type diffusion layer 3 around it. When this influences a difference in potential between the thermal oxide film 9 and the N-type diffusion layer 3 to increase, an electric field increases in an outer end portion of the N-type diffusion layer 14 to deteriorate breakdown voltage performance of the MOSFET. The fourth preferred embodiment includes the polysilicon layer 10 extending more outward than the N-type diffusion layer 14 as illustrated in FIG. 15, so that a difference in potential between the N-type diffusion layer 14 and the thermal oxide film 9 is reduced. Thus, the fourth preferred embodiment enables increasing the breakdown voltage of the MOSFET.

Figure 16:
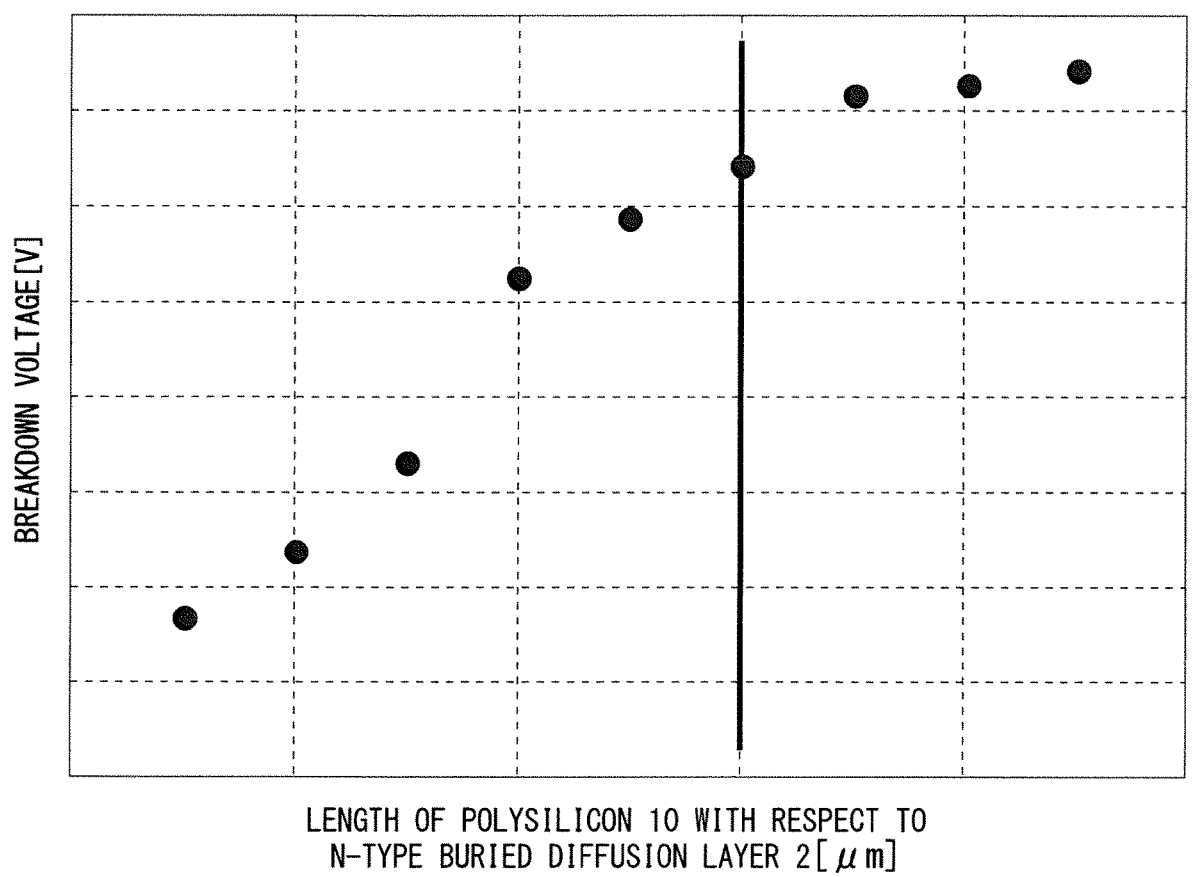
FIG. 16 is a diagram showing results of simulating a relationship between a length of a first polysilicon layer (polysilicon layer 10) extending toward a low-side circuit and breakdown voltage of a MOSFET.

FIG. 16 shows results of simulating a relationship between a length of the polysilicon layer 10 being the first polysilicon layer extending toward the low-side circuit and the breakdown voltage of the MOSFET. FIG. 16 has a horizontal axis representing a length of the N-type diffusion layer 14 with reference to an outer end portion of the N-type buried diffusion layer 2, and a vertical axis. Then, a solid line drawn parallel to the vertical axis represents a position of the outer end portion of the N-type diffusion layer 14. As can be seen from FIG. 16, when the polysilicon layer 10 is extended more outward than the N-type diffusion layer 14, the breakdown voltage of the MOSFET is increased. The fourth preferred embodiment may be combined with the second and third preferred embodiments.

Fifth Preferred Embodiment

Figure 17:
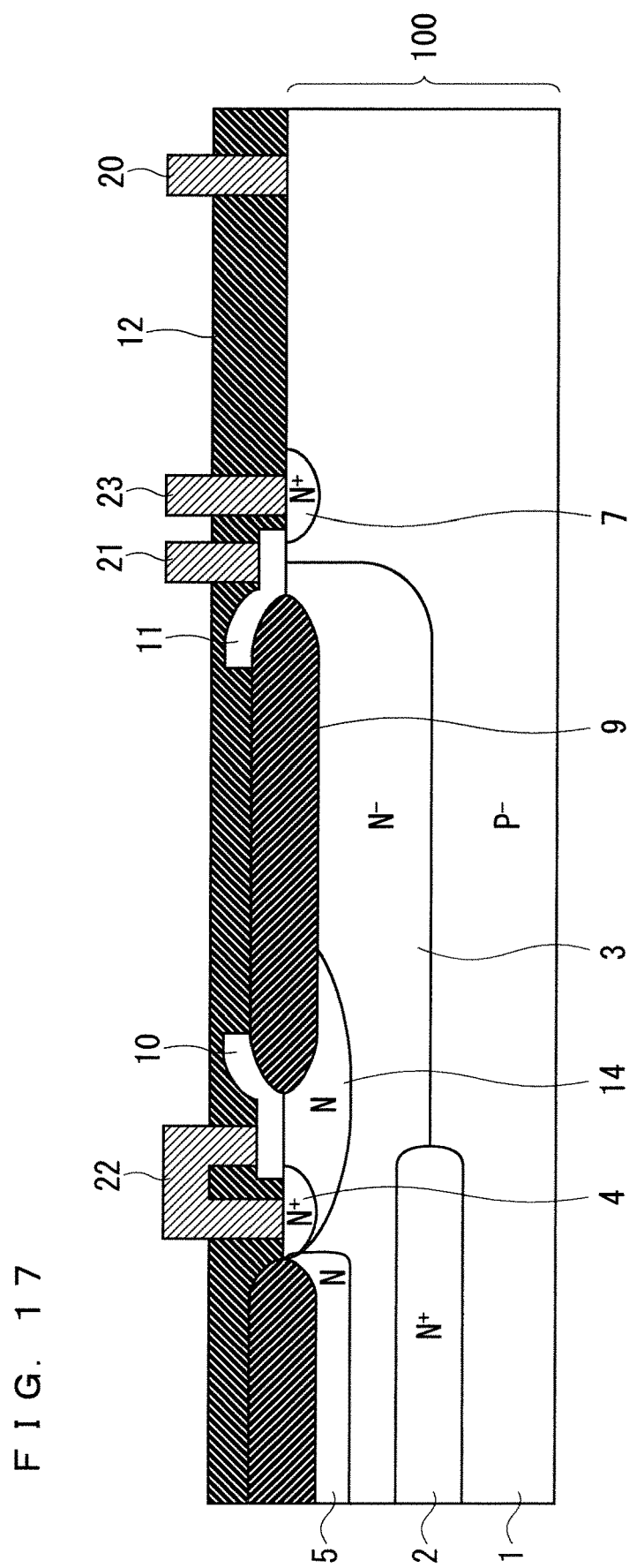
FIG. 17 is a sectional view of a MOSFET formed in a RESURF region of a semiconductor device according to a fifth preferred embodiment.

FIG. 17 is a sectional view of a MOSFET formed in a RESURF region of a semiconductor device according to a fifth preferred embodiment. The first preferred embodiment (FIG. 1) includes the N-type diffusion layer 7 serving as the source region of the MOSFET, being formed in the P-type diffusion layer 6 provided in the N-type diffusion layer 3. In contrast, the fifth embodiment includes an N-type diffusion layer 7 formed inside a P-type diffusion layer 1 outside an N-type diffusion layer 3 while a P-type diffusion layer 6 is eliminated, as illustrated in FIG. 17. FIG. 17 illustrates structure in which a gate electrode 21 provided on a polysilicon layer 11 faces a surface of the P-type diffusion layer 1 between the N-type diffusion layer 7 and the N-type diffusion layer 3, and a channel is formed in the P-type diffusion layer 1 below the gate electrode 21 during an ON operation of the MOSFET.

The first preferred embodiment has the structure including the parasitic PNP transistor composed of the P-type diffusion layer 6, the N-type diffusion layer 3, and the P-type diffusion layer 1, and thus a current flowing through the parasitic PNP transistor (parasitic current) may increase power consumption. In contrast, the fifth preferred embodiment has structure in which such a parasitic PNP transistor is not formed to cause no parasitic current to flow, so that power consumption can be reduced.

The structure of the first preferred embodiment requires the P-type diffusion layer 1 and the P-type diffusion layer 6 to be separated from each other. This requires a sufficient distance between the layers to be secured, and thus causes a problem of increase in size of the MOSFET. In contrast, the structure of the fifth embodiment does not require such separation, so that an effect of enabling reduction in size of the MOSFET is achieved. The fifth preferred embodiment may be combined with the second, third, and fourth preferred embodiments.

Sixth Preferred Embodiment

Figure 18:
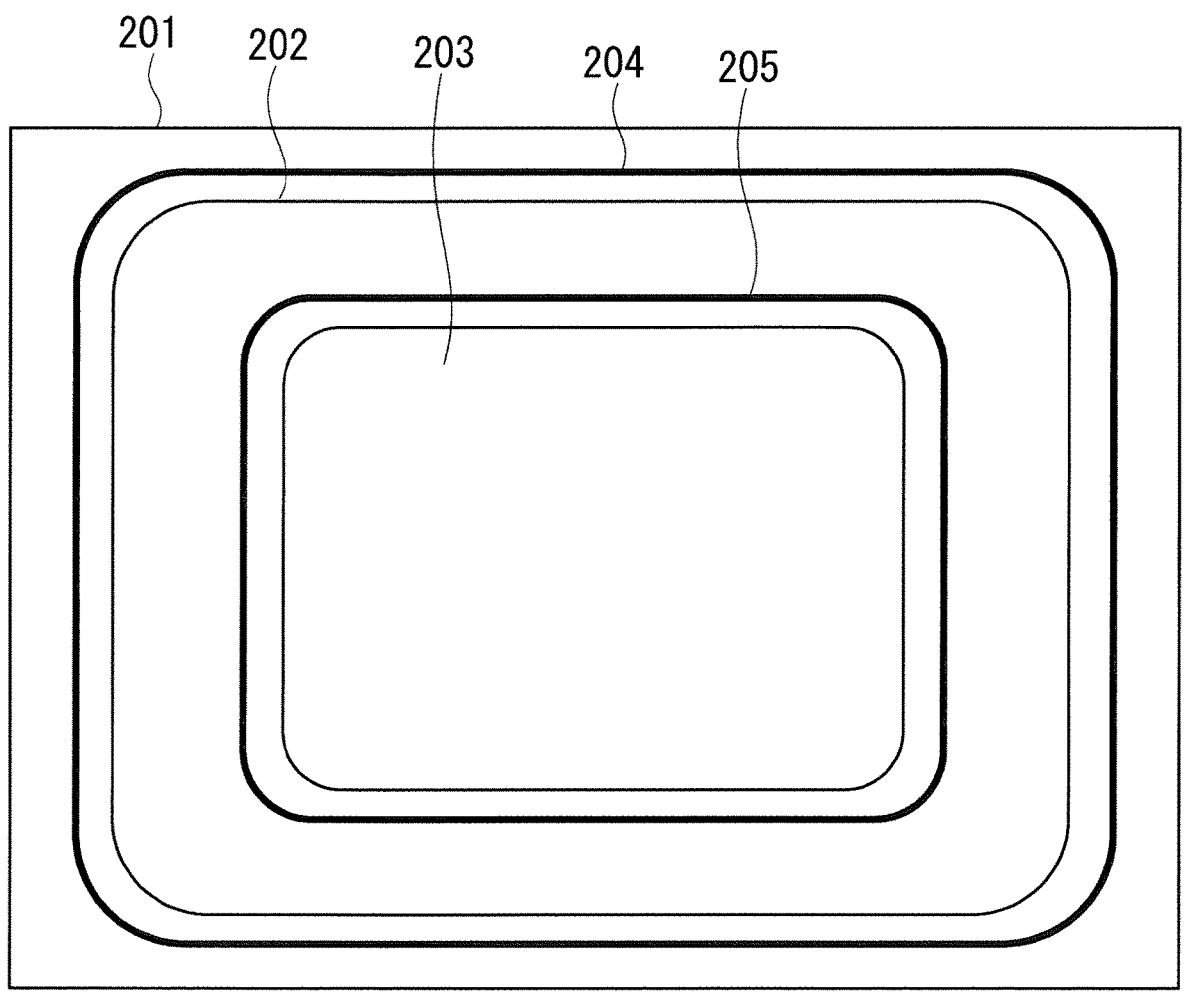
FIG. 18 is a diagram illustrating an example of a high-side circuit.

FIG. 18 is a plan view illustrating a high-side circuit region of a conventional semiconductor device. As illustrated in FIG. 18, the conventional semiconductor device includes an N-type diffusion layer 202 being a second region (RESURF region) that is formed in a P-type semiconductor substrate 201, and an N-type buried diffusion layer 203 being a third region that is formed in an N-type diffusion layer 202. Outside the N-type diffusion layer 202, an electrode 204 to which a reference potential (GND potential) of a low-side circuit is supplied is formed, and inside the N-type diffusion layer 202, an electrode 205 to which a reference potential of a high-side circuit, different from the GND potential, is supplied is formed. When the potential of the electrode 205 rises, the GND potential and the reference potential of the high-side circuit are separated from each other by completely depleting the N-type diffusion layer 202.

Figure 19:
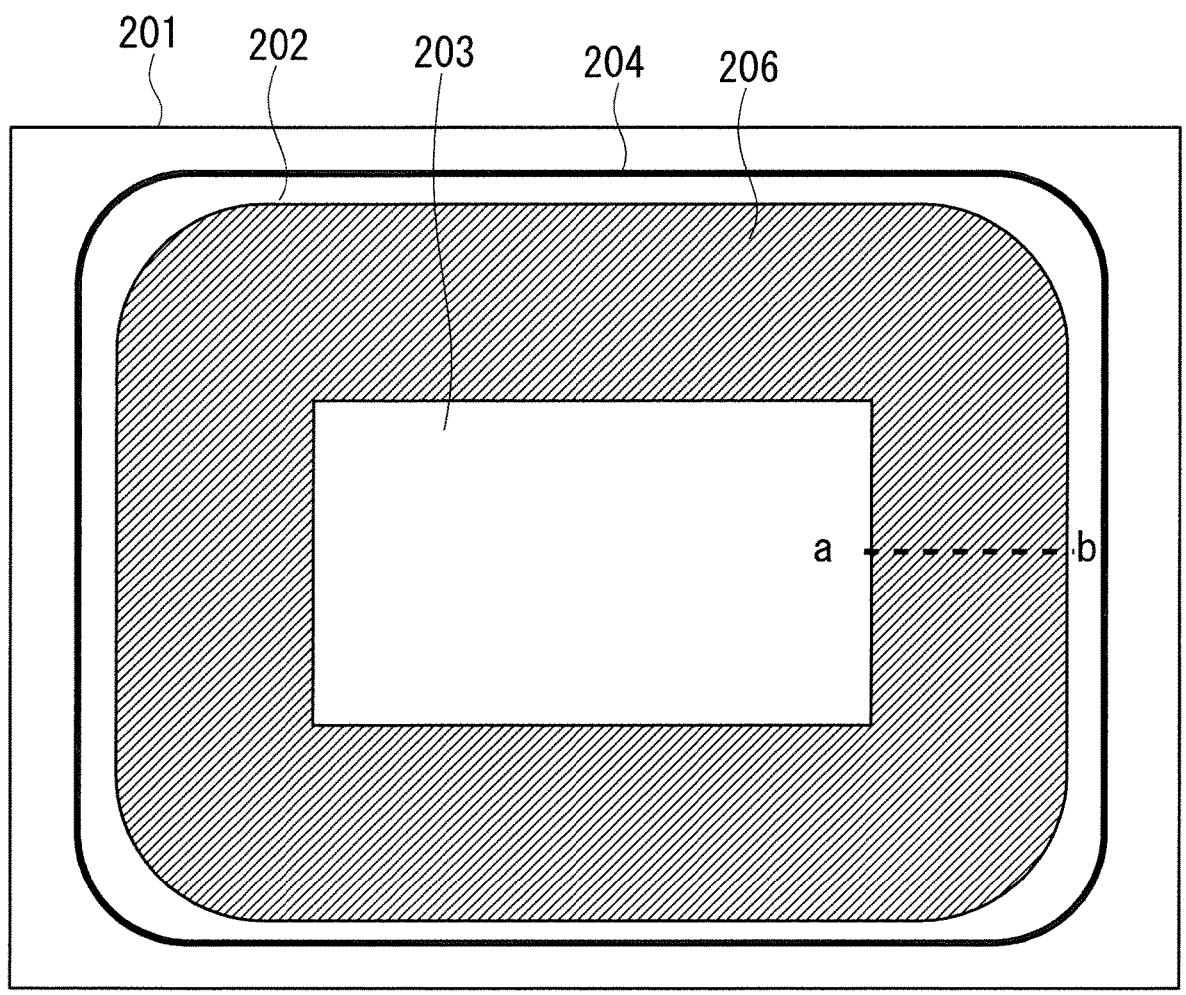
FIG. 19 is a plan view illustrating a semiconductor device and a surrounding high-side circuit region of a sixth preferred embodiment.

FIG. 19 is a plan view illustrating a high-side circuit region of a semiconductor device of a sixth preferred embodiment. As in FIG. 18, the semiconductor device includes an N-type diffusion layer 202 serving as a RESURF region formed in a P-type semiconductor substrate 201, an N-type buried diffusion layer 203 formed in the N-type diffusion layer 202, and an electrode 204 formed outside the N-type diffusion layer 202, to which a reference potential (GND potential) of a low-side circuit is supplied. The semiconductor device of the sixth preferred embodiment includes the N-type diffusion layer 202 serving as a RESURF region surrounding the high-side circuit (hatched portion in FIG. 19), being formed with the MOSFET 206 according to the first preferred embodiment. That is, for example, a cross section taken along line a-b shown in FIG. 19 shows the structure illustrated in FIG. 1.

When a layout as illustrated in FIG. 19 is used, the MOSFET can be mounted without additionally providing a region for forming the MOSFET. Additionally, breakdown voltage between the high-side circuit and the GND potential can be increased by the effect described in the first preferred embodiment.

Figure 20:
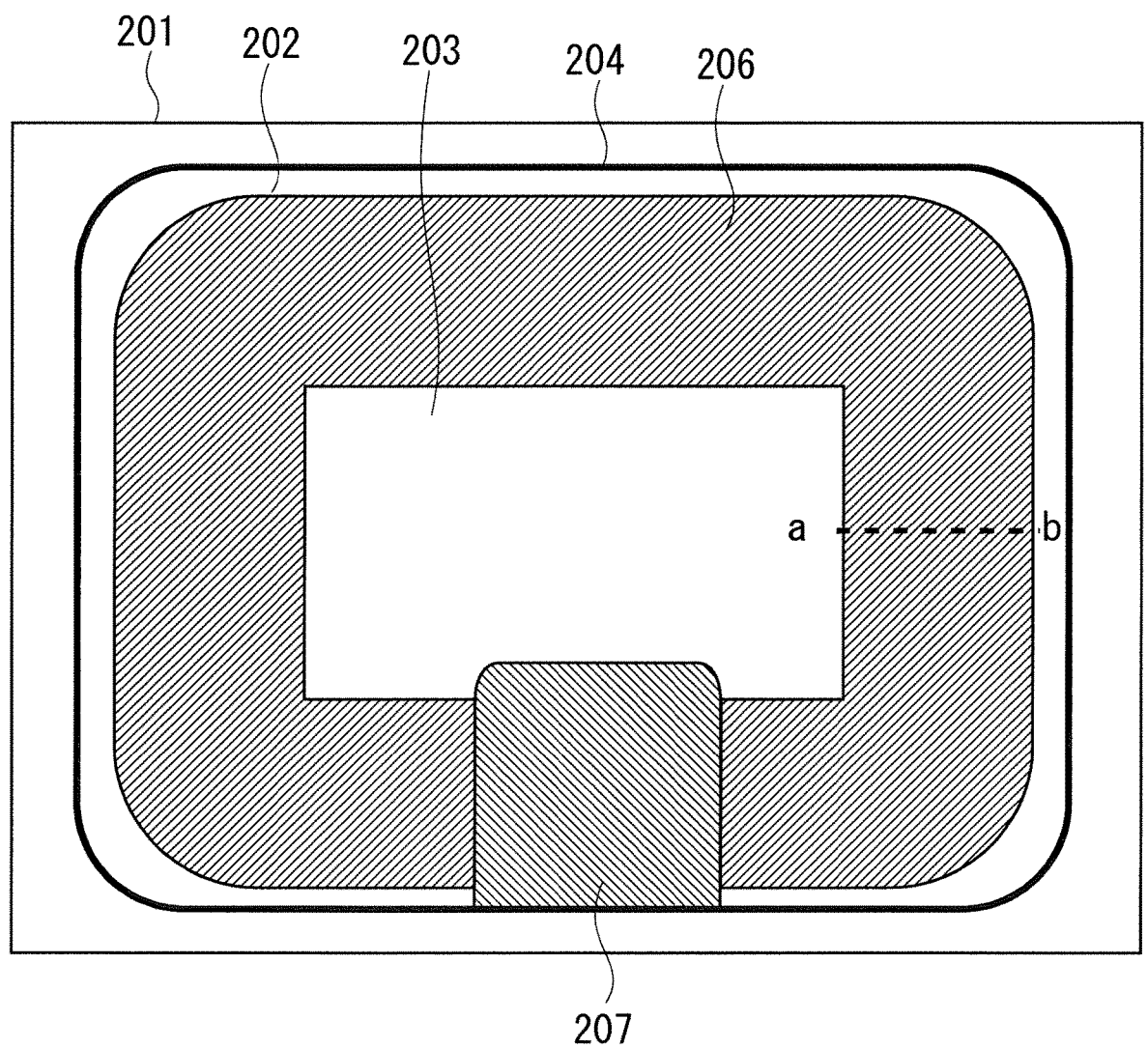
FIG. 20 is a plan view illustrating the semiconductor device, the surrounding high-side circuit region, and a lateral high breakdown voltage MOSFET of the sixth preferred embodiment.

The MOSFET formed in the N-type diffusion layer 202 surrounding the high-side circuit (hatched portion in FIG. 19) may be the MOSFET of the second, third, fourth, or fifth embodiment. As illustrated in FIG. 20, a MOSFET 206 and another MOSFET 207 electrically separated from the MOSFET 206 may be formed between the high-side circuit and the low-side circuit.

Seventh Preferred Embodiment

FIG. 21 is a diagram illustrating a configuration of a drive IC according to a seventh preferred embodiment. This drive IC is configured to drive a switching element that constitutes a half bridge circuit, and includes a high-side circuit 301 that drives an upper switching element 305a, a low-side circuit 302 that drives a lower switching element 305b, and a level shift circuit 303 that transmits a signal between the high-side circuit 301 and the low-side circuit 302. The high-side circuit 301 is supplied with driving power from a power supply 304a, and the low-side circuit 302 is supplied with driving power from the power supply 304a. The upper switching element 305a and the lower switching element 305b each receive a potential from a power supply 306.

Figure 22:
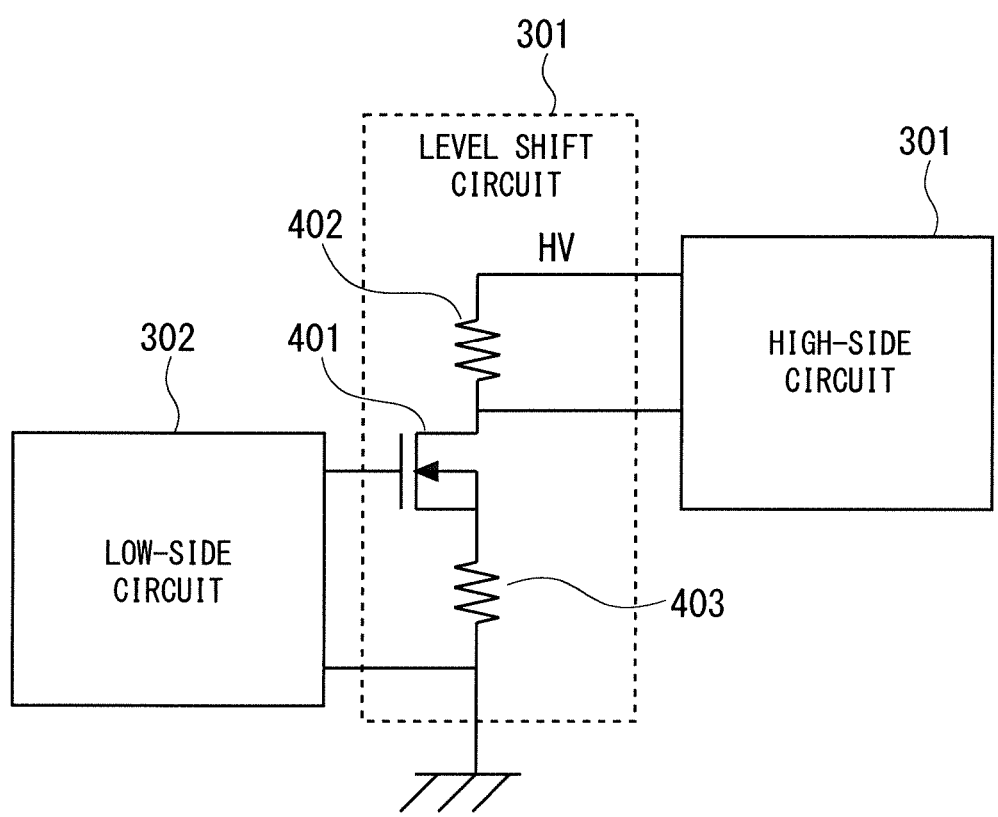
FIG. 22 is a diagram illustrating a configuration of a level shift circuit.

FIG. 22 is a circuit diagram of the level shift circuit 303. The level shift circuit 303 includes a resistance element 402, a MOSFET 401, and a resistance element 403, which are connected in series between the high-side circuit 301 and a GND potential (reference potential of the low-side circuit 302). The low-side circuit 302 outputs a signal to switch on or off the MOSFET 401, and the high-side circuit 301 receives a voltage signal generated in the resistance element 402. This enables the level shift circuit 303 to transmit a signal from the low-side circuit 302 to the high-side circuit 301 while separating a reference potential of the high-side circuit 301 from the reference potential of the low-side circuit 302.

The seventh preferred embodiment uses the MOSFET of the first preferred embodiment as the MOSFET 401 of the level shift circuit 303. The MOSFET of the first embodiment has high breakdown voltage performance and low on-resistance, so that the level shift circuit 303 can be operated in a wider range of potentials and power consumption can be reduced. As the MOSFET 401 of the level shift circuit 303, the MOSFET of the second, third, fourth, or fifth embodiment may be used. The high-side circuit 301, the low-side circuit 302, and the level shift circuit 303 may be formed in the same chip, or may be separated into separate respective chips.

In FIG. 21, a bootstrap circuit may be used instead of the power supply 304a of the high-side circuit 301. FIG. 23 illustrates an example in which a bootstrap circuit is used as the power supply of the high-side circuit 301.

The bootstrap circuit includes a limiting resistor 307, a bootstrap diode 308, and a bootstrap capacitor 309. The limiting resistor 307 and the bootstrap diode 308 are connected in series between the power supply 304b of the low-side circuit 302 and a power input terminal of the high-side circuit 301. The bootstrap capacitor 309 is connected between a connection node between the upper switching element 305a and the lower switching element 305b, and the power input terminal of the high-side circuit 301.

A Vs potential at the connection node between the upper switching element 305a and the lower switching element 305b changes between a potential of the power supply 306 and the GND potential when the upper switching element 305a and the lower switching element 305b are turned on and off. When the Vs potential equals the GND potential, a charge from the power supply 304b is supplied to the bootstrap capacitor 309 through the bootstrap diode 308 to charge the bootstrap capacitor 309. After that, when the Vs potential changes to the potential of the power supply 306, a charge is supplied from the bootstrap capacitor 309 to the power input terminal of the high-side circuit 301, and thus the bootstrap capacitor 309 functions as a power supply of the high-side circuit 301. At this time, the bootstrap diode 308 functions to prevent a current from flowing into the power supply 304b. The limiting resistor 307 functions to limit a current for charging the bootstrap capacitor 309 to a desired value.

Eighth Preferred Embodiment

Figure 24:
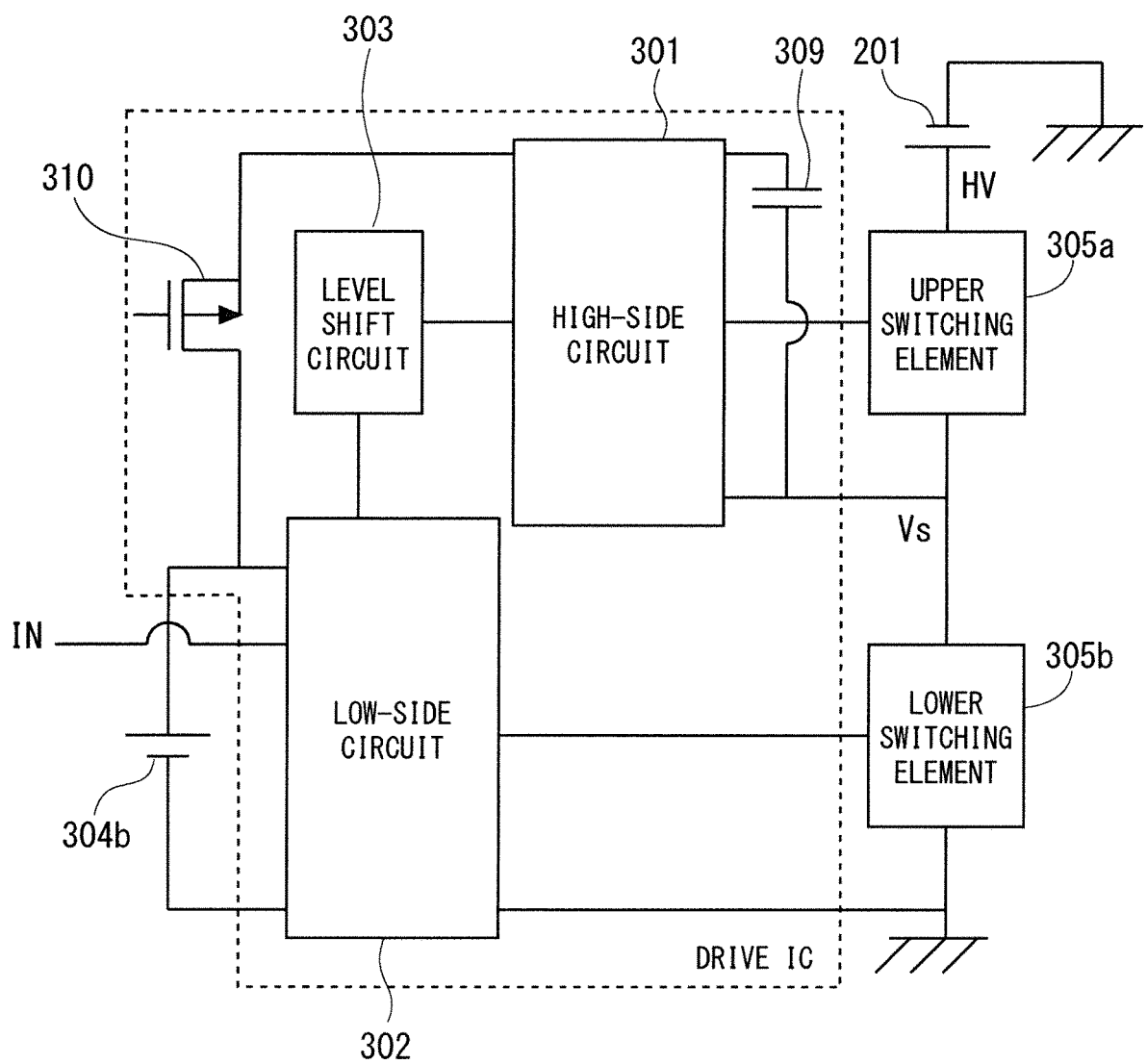
FIG. 24 is a diagram illustrating a configuration of a drive IC according to an eighth preferred embodiment.

FIG. 24 is a configuration diagram of a drive IC according to an eighth preferred embodiment. The drive IC of the eighth preferred embodiment is configured such that the limiting resistor 307 and bootstrap diode 308 of FIG. 23 are replaced with the MOSFET 310 of the first preferred embodiment and the MOSFET 310 is used as a bootstrap diode.

The MOSFET 310 is formed in a RESURF region that separates a high-side circuit 301 and a low-side circuit 302 from each other, as in the fifth preferred embodiment. This enables forming a bootstrap circuit that functions as a power supply for the high-side circuit 301 without using a high breakdown voltage element different from the drive IC including the high-side circuit 301 and the low-side circuit 302. As a result, this can contribute to miniaturization of a driving device including the drive IC of the half bridge circuit. The MOSFET 310 in FIG. 24 may be the MOSFET of the second, third, fourth, or fifth preferred embodiment. The high-side circuit 301, the low-side circuit 302, and the level shift circuit 303 may be formed in the same chip, or may be separated into separate respective chips.

Ninth Preferred Embodiment

Figure 25:
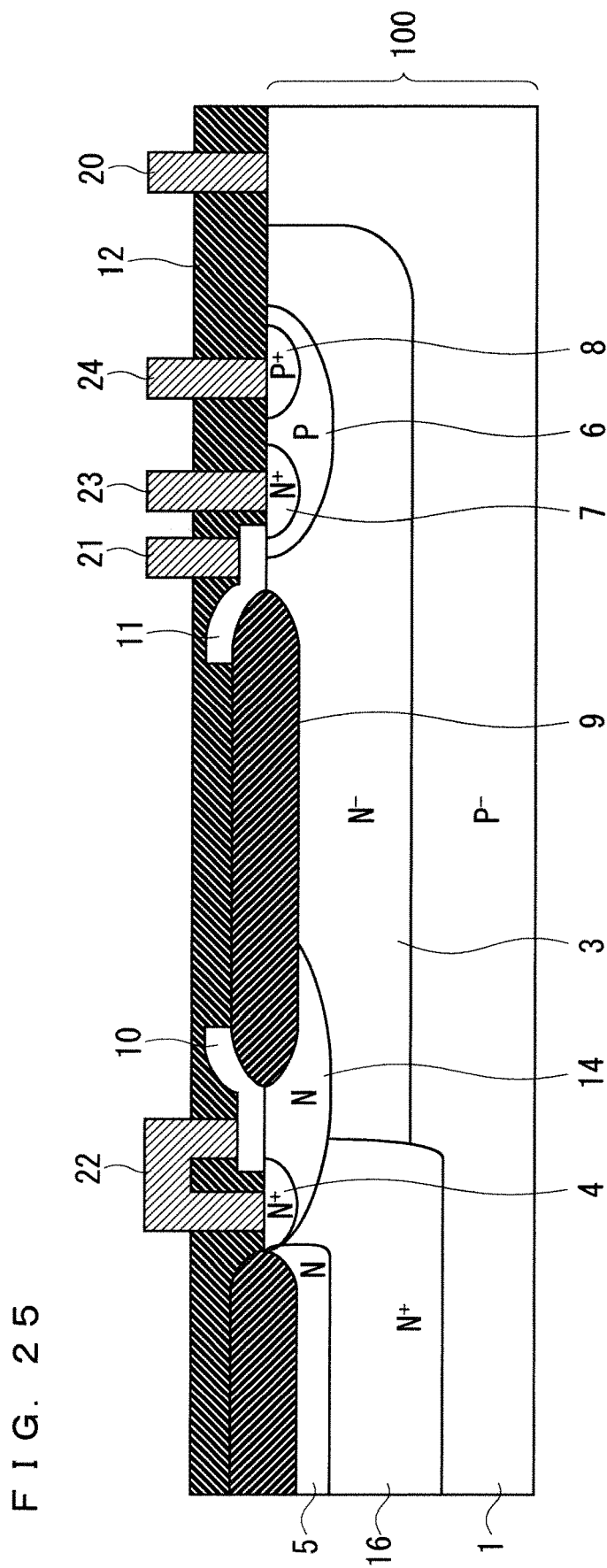
FIG. 25 is a sectional view of a MOSFET formed in a RESURF region of a semiconductor device according to a ninth preferred embodiment.

FIG. 25 is a sectional view of a MOSFET formed in a RESURF region of a semiconductor device according to a ninth preferred embodiment. FIG. 25 illustrates structure that is different from the structure of FIG. 1 in that an N-type diffusion layer 16 having a higher peak concentration of impurities than the N-type diffusion layer 3 is formed as a third region, instead of the N-type buried diffusion layer 2. Although the N-type buried diffusion layer 2 is buried inside a semiconductor substrate 100 (near a bottom portion of the N-type diffusion layer 3), the N-type diffusion layer 16 is formed from a surface portion of the semiconductor substrate 100 to the bottom portion of the N-type diffusion layer 3. The N-type diffusion layer 16 is deeper than the N-type diffusion layer 14.

Additionally, the N-type diffusion layer 16 does not satisfy the RESURF condition. That is, when the N-type diffusion layer 16 has an impurity concentration indicated as N [cm$^{-3}$] and a depth indicated as t [cm], a relationship, N×t>6.9×10$^{11}$ cm$^{-2}$, is satisfied. Thus, the ninth preferred embodiment does not allow the N-type diffusion layer 16 to be completely depleted when breakdown voltage is maintained, and allows an electric field to be concentrated in an outer end portion of the N-type diffusion layer 16. This causes the electric field to concentrate in both the N-type diffusion layer 14 and the N-type diffusion layer 16, so that an operation and an effect as in the first preferred embodiment can be obtained. Even in the present embodiment, the N-type diffusion layer 5 may be eliminated.

The ninth preferred embodiment does not require a diffusion layer having structure embedded inside the semiconductor substrate 100 to be formed. This enables a semiconductor device having an operation and an effect as in the first preferred embodiment to be formed by a usual impurity diffusion step. The ninth embodiment may be also applied to the semiconductor device of the second, third, fourth, fifth, sixth, seventh, or eighth embodiment to replace the N-type buried diffusion layer 2 with the N-type diffusion layer 16.

The respective embodiments can be freely combined, or the respective embodiments can be appropriately modified or eliminated.

While the disclosure has been shown and described in detail, the foregoing description is in all aspects illustrative and not restrictive. It is therefore understood that numerous modifications and variations can be devised without departing from the scope of the disclosure.

What is claimed is:

1. A semiconductor device comprising:
a semiconductor substrate formed with a first region of a first conductivity type;
a second region that is a RESURF region of a second conductivity type formed in a surface portion of the first region and separating a high-side circuit and a low-side circuit from each other, the high-side circuit being surrounded by the second region and the low-side circuit being formed outside of the second region, the high-side circuit being configured to operate using a reference potential different from a reference potential of the low-side circuit;
a third region of the second conductivity type formed at least in a bottom portion of the second region close to the high-side circuit, having a higher peak concentration of impurities than the second region; and
a MOSFET using the second region as a drift layer, the MOSFET being included in a level shift circuit that transmits a signal between the low-side circuit and the high-side circuit, or in a bootstrap circuit as a power supply for the high-side circuit,
the MOSFET including:
a fourth region serving as a drain region of the second conductivity type formed in the surface portion of the second region, having a higher peak concentration of impurities than the second region;
a sixth region serving as a source region of the second conductivity type formed in a surface portion of a fifth region of the first conductivity type or in a surface portion of the first region, in a region closer to the low-side circuit than the fourth region, the fifth region being provided in the second region;

a first thermal oxide film formed on a surface of the second region, in a region between the fourth region and the sixth region; and a seventh region of the second conductivity type formed in a surface portion of the second region below the first thermal oxide film, having a higher peak concentration of impurities than the second region, wherein an end portion of the seventh region close to the low-side circuit is located closer to the low-side circuit than an end portion of the third region close to the low-side circuit.

2. The semiconductor device according to claim 1, wherein when the seventh region has an impurity concentration indicated as N [cm$^{-3}$] and a depth indicated as t [cm], a relationship, N×t>6.9×10$^{11}$ [cm$^{-2}$], is satisfied.

* * * * *